(12) United States Patent
Yamamichi et al.

(10) Patent No.: US 8,106,582 B2
(45) Date of Patent: Jan. 31, 2012

(54) ORGANIC ELECTROLUMINESCENCE DISPLAY DEVICE

(75) Inventors: Keiko Yamamichi, Sodegaura (JP);
Kenichi Fukuoka, Sodegaura (JP);
Kimihiro Yuasa, Sodegaura (JP);
Chishio Hosokawa, Sodegaura (JP);
Hitoshi Kuma, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 323 days.

(21) Appl. No.: 10/591,688

(22) PCT Filed: Feb. 18, 2005

(86) PCT No.: PCT/JP2005/002558
§ 371 (c)(1),
(2), (4) Date: Sep. 5, 2006

(87) PCT Pub. No.: WO2005/086539
PCT Pub. Date: Sep. 15, 2005

(65) Prior Publication Data
US 2007/0200123 A1    Aug. 30, 2007

(30) Foreign Application Priority Data
Mar. 5, 2004  (JP) ................... 2004-062774
May 21, 2004  (JP) ................... 2004-151625

(51) Int. Cl.
*H01L 51/52*   (2006.01)
*H01J 9/24*    (2006.01)
(52) U.S. Cl. ........................... 313/506; 445/23
(58) Field of Classification Search .......... 313/498–512; 445/23
See application file for complete search history.

(56) References Cited

U.S. PATENT DOCUMENTS

| | | | |
|---|---|---|---|
| 6,462,470 B1 * | 10/2002 | Ootsuki et al. | 313/504 |
| 6,464,898 B1 * | 10/2002 | Tomoike et al. | 252/301.35 |
| 7,030,553 B2 * | 4/2006 | Winters et al. | 313/504 |
| 2003/0184688 A1 * | 10/2003 | Kim | 349/43 |
| 2005/0140277 A1 * | 6/2005 | Suzuki et al. | 313/504 |

FOREIGN PATENT DOCUMENTS

| | | |
|---|---|---|
| JP | 6 275381 | 9/1994 |
| JP | 2002 100483 | 4/2002 |
| JP | 2002 373776 | 12/2002 |
| JP | 2003 142277 | 5/2003 |
| JP | 2003 234186 | 8/2003 |
| JP | 2003 272855 | 9/2003 |
| JP | 2004 55461 | 2/2004 |
| WO | 01 39554 | 5/2001 |

\* cited by examiner

*Primary Examiner* — Karabi Guharay
*Assistant Examiner* — Zachary Snyder
(74) *Attorney, Agent, or Firm* — Oblon, Spivak, McClelland, Maier & Neustadt, L.L.P.

(57) ABSTRACT

An organic electroluminescent display (1) including: a substrate (11); and a first organic electroluminescent device part (10) and a second organic electroluminescent device part (20) placed side by side on a surface of the substrate; the first organic electroluminescent device part (10) including at least a light reflective conductive layer (12), an organic luminescent medium layer (13), and a transparent electrode layer (15) in this order and including a light reflective layer (14) inside or outside of the organic luminescent medium layer (13) or the transparent electrode layer (15); the second organic electroluminescent device part (20) including at least a light reflective conductive layer (12), a first inorganic compound layer (21), an organic luminescent medium layer (13), and a transparent electrode layer (15) in this order and including a light reflective layer (14) inside or outside of the organic luminescent medium layer (13) or the transparent electrode layer (15); and an emission spectrum of light from the first organic electroluminescent device part (10) differing from an emission spectrum of light from the second organic electroluminescent device part (20).

20 Claims, 6 Drawing Sheets

(a)

(b)

(c)

ORGANIC ELECTROLUMINESCENCE DISPLAY DEVICE

TECHNICAL FIELD

The invention relates to an organic electroluminescent display. In particular, the invention relates to an organic electroluminescent display in which multicolor emission is achieved by placing organic electroluminescent device parts provided with resonator structures having different optical lengths side by side on a substrate.

BACKGROUND ART

As technology of forming a full-color display using organic electroluminescence ("electroluminescence" and "electroluminescent" hereinafter may be abbreviated as "EL"), a three-color pattern formation method, a method of combining white EL with a color filter, a method of combining EL, a color conversion film, and a color filter, and the like have been known.

The three-color pattern formation method may achieve a high efficiency by adjusting the material balance and reducing the loss of a circular polarizer. On the other hand, since it is difficult to realize a high-definition display using the three-color pattern formation method due to difficulty in forming a three-color pattern, it is considered that a large-screen display cannot be formed.

The method of combining white EL with a color filter has a problem in which white EL emission efficiency is poor.

The method of combining EL with a color conversion film has a problem such as a poor red conversion efficiency, although various improvements have been made.

A full-color display method is divided into a bottom-emission structure and a top-emission structure. In the top-emission structure, light is outcoupled from the side opposite to the substrate, differing from a related-art structure in which light is outcoupled through a TFT glass substrate. This improves the aperture ratio with respect to the emitting part, whereby the luminance can be increased.

A method has been studied in which a semitransparent cathode is used as the upper electrode and only light having a specific wavelength is outcoupled from the EL device utilizing a multiple interference effect to achieve high color reproducibility. For example, an organic EL device has been disclosed in which a first electrode formed of a light reflecting material, an organic layer including an organic emitting layer, a semitransparent reflective layer and a second electrode formed of a transparent material are stacked so that the organic layer serves as a resonator and in which the following expression is satisfied when the peak wavelength of the spectrum of light to be outcoupled is λ (see patent document 1).

$$(2L)/\lambda + \Phi/(2\pi) = m$$

Where L indicates the optical length, λ indicates the wavelength of light to be outcoupled, m indicates an integer, and Φ indicates the phase shift, configured so that the optical length L is the minimum positive value.

A display has also been disclosed in which each of R, G, and B pixels has a structure in which an organic EL layer is placed between a light reflective layer and a transparent layer and a color filter is disposed on the light-outcoupling side or the external light incident side of the transparent layer (see patent document 2).

[Patent document 1] WO01/39554
[Patent document 2] JP-A-2002-373776

However, the above EL device or display has the following problems.

(1) In order to form a full-color display, it is necessary to fabricate an EL device corresponding to each color. This requires that the EL device have a thickness corresponding to each color in pixel units, thereby making production difficult.

(2) The light selectivity may be insufficient since conditions where m in the above expression is small are utilized.

The invention was achieved in view of the above-described problems. An object of the invention is to provide an organic EL display which allows multicolor emission without decreasing the efficiency of the organic EL device and which is easily produced.

Through research for solving the foregoing subject, the inventors found that organic EL devices can emit light in different colors (multicolor emission) by adjusting optical thickness of a resonator in each device formed on the same substrate using an inorganic compound layer, and that an organic luminescent medium layer, light reflective layer, transparent electrode and the like can be each formed as a single common layer even in organic EL devices (pixels) emitting light in different colors without need of forming different layers in each device so that an organic EL display with high efficiency can easily fabricated. They completed the invention based on the findings.

The invention provides the following organic EL display and its production method.

1. An organic electroluminescent display comprising: a substrate; and a first organic electroluminescent device part and a second organic electroluminescent device part placed side by side on a surface of the substrate; the first organic electroluminescent device part including at least a light reflective conductive layer, an organic luminescent medium layer, and a transparent electrode layer in this order and including a light reflective layer inside or outside of the organic luminescent medium layer or the transparent electrode layer; the second organic electroluminescent device part including at least a light reflective conductive layer, a first inorganic compound layer, an organic luminescent medium layer, and a transparent electrode layer in this order and including a light reflective layer inside or outside of the organic luminescent medium layer or the transparent electrode layer; and an emission spectrum of light from the first organic electroluminescent device part differing from an emission spectrum of light from the second organic electroluminescent device part.

2. An organic electroluminescent display comprising: a substrate; and a first organic electroluminescent device part and a second organic electroluminescent device part placed side by side on a surface of the substrate; the first organic electroluminescent device part including at least a light reflective conductive layer, a first inorganic compound layer, an organic luminescent medium layer, and a transparent electrode layer in this order and including a light reflective layer inside or outside of the organic luminescent medium layer or the transparent electrode layer; the second organic electroluminescent device part including at least a light reflective conductive layer, a first inorganic compound layer, a second inorganic compound layer, an organic luminescent medium layer, and a transparent electrode layer in this order and including a light reflective layer inside or outside of the organic luminescent medium layer or the transparent electrode layer; and an emission spectrum of light from the first organic electroluminescent device part differing from an emission spectrum of light from the second organic electroluminescent device part.

3. An organic electroluminescent display comprising: a substrate; and a first organic electroluminescent device part, a second organic electroluminescent device part, and a third organic electroluminescent device part placed side by side on a single surface of the substrate; the first organic electroluminescent device part including at least a light reflective conductive layer, an organic luminescent medium layer, and a transparent electrode layer in this order and including a light reflective layer inside or outside of the organic luminescent medium layer or the transparent electrode layer; the second organic electroluminescent device part including at least a light reflective conductive layer, a first inorganic compound layer, an organic luminescent medium layer, and a transparent electrode layer in this order and including a light reflective layer inside or outside of the organic luminescent medium layer or the transparent electrode layer; the third organic electroluminescent device part including at least a light reflective conductive layer, a first inorganic compound layer, a second inorganic compound layer, an organic luminescent medium layer, and a transparent electrode layer in this order and including a light reflective layer inside or outside of the organic luminescent medium layer or the transparent electrode layer; and emission spectra of light from the first, second, and third organic electroluminescent device parts differing from one another.

4. The organic electroluminescent display according to any one of 1 to 3, wherein at least one of the first inorganic compound layer and the second inorganic compound layer is an inorganic compound layer subjected to crystallization treatment.

5. The organic electroluminescent display according to any one of 1 to 4, wherein at least one of the first inorganic compound layer and the second inorganic compound layer includes an inorganic oxide.

6. The organic electroluminescent display according to 4, wherein the first inorganic compound layer and the second inorganic compound layer include an inorganic oxide, and crystallinity of the first inorganic compound layer is higher than crystallinity of the second inorganic compound layer.

7. The organic electroluminescent display according to 6, wherein the first inorganic compound layer is crystalline, and the second inorganic compound layer is noncrystalline.

8. The organic electroluminescent display according to any one of 1 to 7, wherein at least one of the first inorganic compound layer and the second inorganic compound layer includes an oxide of an element selected from the group consisting of In, Sn, Zn, Ce, Sm, Pr, Nb, Tb, Cd, Ga, Al, Mo, and W.

9. The organic electroluminescent display according to any one of 1 to 7, wherein at least one of the first inorganic compound layer and the second inorganic compound layer includes an oxide of an element selected from the group consisting of In, Sn, and Zn.

10. The organic electroluminescent display according to any one of 1 to 9, wherein the light reflective conductive layer includes a metal selected from the group consisting of Al, Ag, Au, Pt, Cu, Mg, Cr, Mo, W, Ta, Nb, Li, Mn, Ca, Yb, Ti, Ir, Be, Hf, Eu, Sr, Ba, Cs, Na, and K, or an alloy containing at least one metal selected from the group.

11. The organic electroluminescent display according to any one of 1 to 10, wherein the light reflective layer includes one, or two or more metal elements selected from the group consisting of Al, Ag, Au, Pt, Cu, Mg, Cr, Mo, W, Ta, Nb, Li, Mn, Ca, Yb, Ti, Ir, Be, Hf, Eu, Sr, Ba, Cs, Na, and K.

12. The organic electroluminescent display according to any one of 1 to 11, further comprising a color conversion part.

13. The organic electroluminescent display according to any one of 1 to 12, further comprising a color filter.

14. The organic electroluminescent display according to 12, wherein the color conversion part is a fluorescence conversion film.

15. A method of producing the organic electroluminescent display according to any one of 1 to 14, the method comprising forming at least one of the first inorganic compound layer and the second inorganic compound layer by wet etching.

The organic EL display according to the invention allows multicolor emission without decreasing the luminous efficiency of the organic EL device by forming the organic EL devices having different resonators on a substrate.

Since the optical thickness of the optical resonator is controlled by forming the inorganic compound layer over the light reflective conductive layer, the optical thickness of each organic EL device part can be arbitrarily adjusted without changing the thickness of the organic luminescent medium layer optimally set for the emitting device.

Moreover, since the thickness of the organic luminescent medium layer and the like need not be adjusted in units of EL device parts which emit light of different colors, the organic EL display according to the invention can be easily produced.

BEST MODE FOR CARRYING OUT THE INVENTION

First Embodiment

Figure 1:
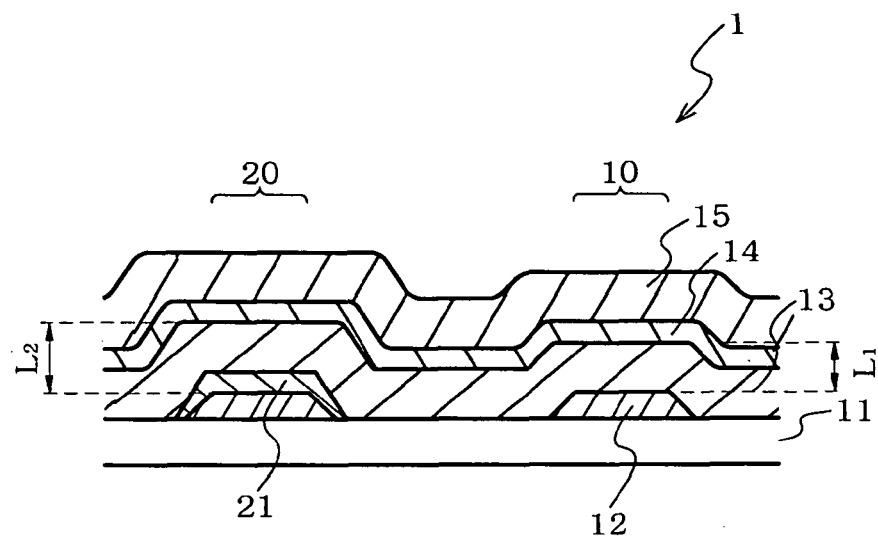
FIG. 1 is a view showing an organic EL display according to a first embodiment.

FIG. 1 is a view showing an organic EL display according to a first embodiment of the invention.

An organic EL display 1 includes a first organic EL device part 10 and a second organic EL device part 20 placed side by side on a substrate 11.

The first organic EL device part 10 has a structure in which a light reflective conductive layer 12, an organic luminescent medium layer 13, a light reflective layer 14, and a transparent electrode layer 15 are stacked in this order on the substrate 11.

The second organic EL device part 20 has a structure in which the light reflective conductive layer 12, a first inorganic compound layer 21, the organic luminescent medium layer 13, the light reflective layer 14, and the transparent electrode layer 15 are stacked in this order on the substrate 11.

The light reflective conductive layer 12 functions as an electrode which supplies holes or electrons, and reflects light from the organic luminescent medium layer 13 in the light-outcoupling direction (upward direction in FIG. 1). The luminescent medium layer 13 includes an organic emitting layer and emits light upon recombination of electrons and holes. The light reflective layer 14 reflects and transmits light from the organic luminescent medium layer 13. The transparent electrode layer 15 is an electrode which supplies holes or electrons and through which light from the organic luminescent medium 13 passes and is outcoupled.

The first inorganic compound layer 21 formed in the second organic EL device part 20 is a layer for adjusting the optical thickness so that the second organic EL device part 20 emits light of a color differing from that of the first organic EL device part 10.

In the organic EL display 1, the first organic EL device part 10 and the second organic EL device part 20 have a resonator structure in which a resonator is formed between the light reflective conductive layer 12 and the light reflective layer 14. In the device having a resonator structure, light from the organic luminescent medium 13 is repeatedly reflected between two light reflecting surfaces (light reflective conductive layer 12 and light reflective layer 14) so that light having a wavelength satisfying the following expression is selectively enhanced in comparison with light having other wavelengths and outcoupled from the device.

$$(2L)/\lambda + \Phi/(2\pi) = m$$

Where L indicates the optical length, $\lambda$ indicates the wavelength of light to be outcoupled, m indicates an integer, and $\Phi$ indicates the phase shift in the light reflective conductive layer 12 and the light reflective layer 14.

The optical length L is the product ($nL_R$) of the refractive index n and the actual length $L_R$ of the medium through which light passes.

In this embodiment, the optical length (optical thickness) is set at L1 for the first organic EL device part 10, and is set at L2 for the second organic EL device part 20. The optical lengths L1 and L2 differ in an amount corresponding to the thickness of the first inorganic compound layer 21.

Specifically, the optical length may be set for the first organic EL device part 10 so that light having a specific wavelength $\lambda 1$ is enhanced and outcoupled from the device, and the optical length may be set for the second organic EL device part 20 so that light having a wavelength $\lambda 2$ differing from the wavelength $\lambda 1$ is enhanced and outcoupled from the device. This allows the emission spectra of light outcoupled from these device parts to differ, whereby multicolor emission can be achieved.

In the first organic EL device part 10 and the second organic EL device part 20, each of the organic luminescent medium layer 13, the light reflective layer 14, and the transparent electrode layer 15 may be formed using a single film. This is advantageous from the viewpoint of industrial production since the production process can be simplified.

Second Embodiment

Figure 2:
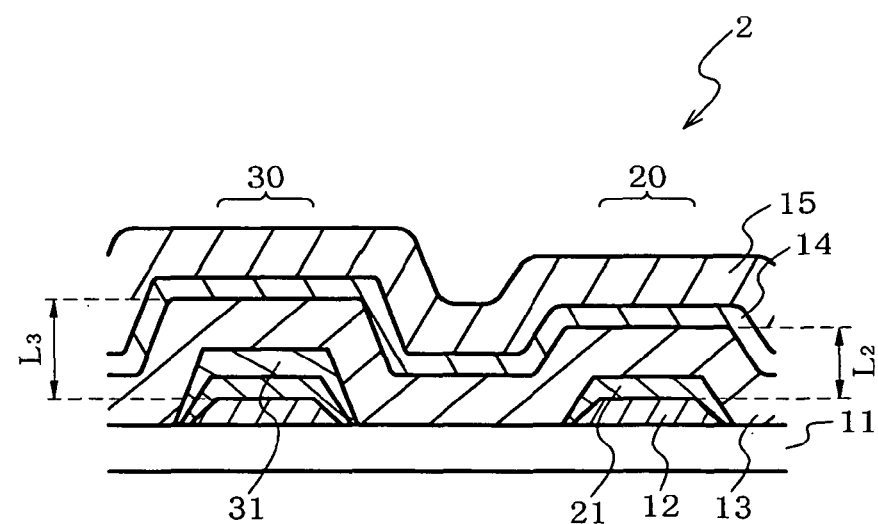
FIG. 2 is a view showing an organic EL display according to a second embodiment.

FIG. 2 is a view showing an organic EL display according to a second embodiment of the invention.

An organic EL display 2 includes the second organic EL device part 20 and a third organic EL device part 30 placed side by side on the substrate 11.

The second organic EL device part 20 is the same as in the first embodiment.

The third organic EL device part 30 has a structure in which the light-reflective conductive layer 12, the first inorganic compound layer 21, a second inorganic compound layer 31, the organic luminescent medium layer 13, the light-reflective layer 14, and the transparent electrode layer 15 are stacked in this order on the substrate 11. Specifically, the third organic EL device part 30 is formed in the same manner as the second organic EL device part 20 except that the second inorganic compound layer 31 is formed. The function of each layer is the same as in the second organic EL device part 20.

The second inorganic compound layer 31 formed in the third organic EL device part 30 is a layer for adjusting the optical thickness so that the third organic EL device part 30 emits light of a color differing from that of the second organic EL device part 20.

In the organic EL display 2, the second organic EL device part 20 and the third organic EL device part 30 have a resonator structure in which a resonator is formed between the light reflective conductive layer 12 and the light reflective layer 14. The optical length (optical thickness) is set at L2 for the second organic EL device part 20, and is set at L3 for the third organic EL device part 30. The optical lengths L2 and L3 differ in an amount corresponding to the thickness of the second inorganic compound layer 31.

Specifically, the optical length may be set for the second organic EL device part 20 so that light having a specific wavelength $\lambda 2$ is enhanced and outcoupled from the device, and the optical length may be set for the third organic EL device part 30 so that light having a wavelength $\lambda 3$ differing from the wavelength $\lambda 2$ is enhanced and outcoupled from the device. This allows the emission spectra of light outcoupled from these device parts to differ, whereby multicolor emission can be achieved.

In this embodiment, the optical lengths of the resonators of the second organic EL device part 20 and the third organic EL device part 30 can be controlled by the thicknesses of the inorganic compound layers 21 and 31 instead of the thickness of the organic luminescent medium layer 13. This allows the optical length of the resonator to be adjusted while maintaining the thickness optimum for an organic compound used for the organic luminescent medium layer 13 to efficiently function. Therefore, an organic EL display can be produced which can achieve multicolor emission without decreasing the luminous efficiency of the organic EL device.

In this embodiment, two EL device parts (i.e. second organic EL device part 20 and third organic EL device part 30) are placed side by side on the substrate 11. Note that this embodiment is not limited thereto. For example, a fourth organic EL device part in which three inorganic compound layers are provided may be formed on the substrate 11 so that three EL device parts are placed side by side on the substrate 11.

Third Embodiment

Figure 3:
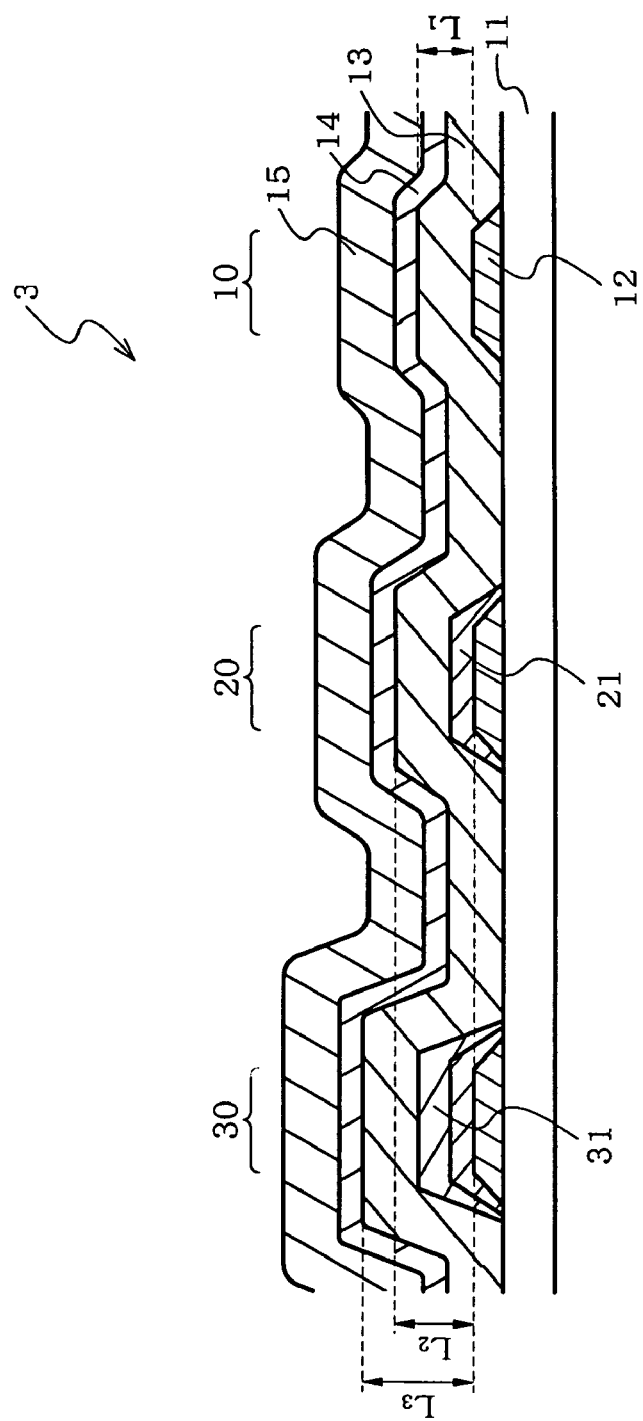
FIG. 3 is a view showing an organic EL display according to a third embodiment.

FIG. 3 is a view showing an organic EL display according to a third embodiment of the invention.

An organic EL display 3 includes the first organic EL device part 10, the second organic EL device part 20, and the third organic EL device part 30 placed side by side on the substrate 11.

The configuration of each of the organic EL device parts 10, 20, and 30 is the same as in the first and second embodiments. The function of each layer is also the same as in the first and second embodiments.

In the organic EL display 3, the organic EL device parts 10, 20, and 30 respectively have resonator structures which differ in the optical length (optical thickness). Specifically, the optical length is set at L1 for the first organic EL device part 10, set at L2 for the second organic EL device part 20, and set at L3 for the third organic EL device part 30.

Therefore, light having different wavelengths (λ1, λ2, λ3) is respectively enhanced in the organic EL device parts 10, 20, and 30 and outcoupled from the devices. This allows the emission spectra of light outcoupled from these device parts to differ, whereby multicolor emission can be achieved. In particular, a full-color organic EL display can be obtained by setting the optical length of the resonator so that the device parts emit light of different colors of the three primary colors.

Each organic EL device part shown in FIGS. 1 to 3 is a top emission type in which light is outcoupled through the transparent electrode 15. Note that the organic EL device part may be a bottom emission type in which light is outcoupled through the substrate 11.

Figure 4:
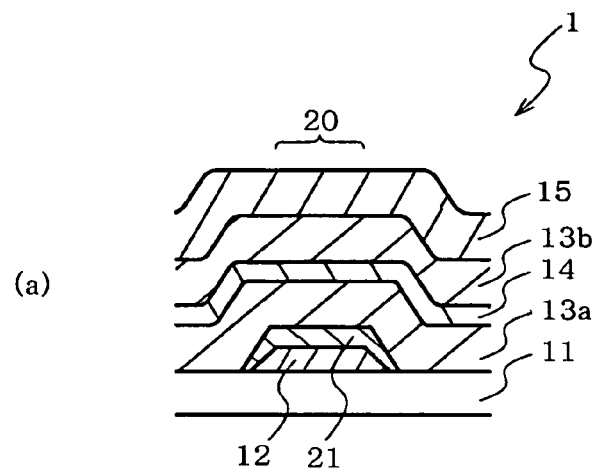
FIG. 4 is a view showing examples of the formation position of a light reflective layer.
Figure 4:
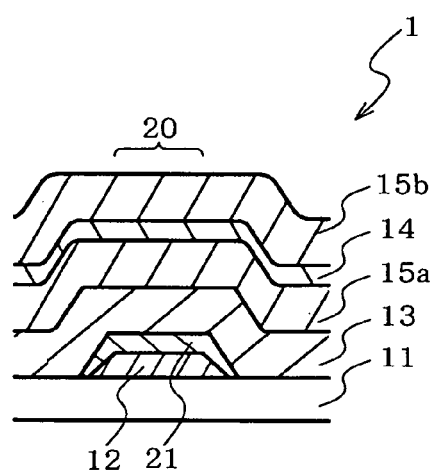
Figure 4:
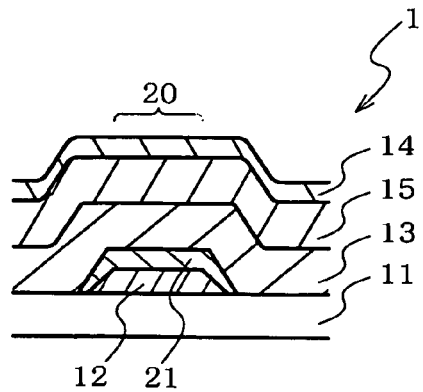

In each organic EL device part, the light reflective layer is formed between the organic luminescent medium and the transparent electrode layer. Note that the light reflective layer may be formed inside or outside of the organic luminescent medium or the transparent electrode layer. FIG. 4 illustrates examples of the formation position of the light reflective layer.

As shown in FIG. 4($a$), the light reflective layer 14 may be provided inside (between organic luminescent media 13$a$ and 13$b$) of the organic luminescent medium, for example. In this case, light from the organic luminescent medium 13$a$ positioned between the light reflective conductive layer 12 and the light reflective layer 14 is adjusted by the resonator, and light from the organic luminescent medium 13$b$ positioned on the upper side (light-outcoupling side) of the light reflective layer 14 is outcoupled without being adjusted by the resonator.

The light reflective layer 14 may be provided inside (between organic luminescent media 15$a$ and 15$b$) of the transparent electrode, as shown in FIG. 4($b$), or may be provided outside of the transparent electrode, as shown in FIG. 4($c$). This allows the optical length of the resonator to be adjusted by changing the thickness of the transparent electrode.

The constituent members of the organic EL display of the invention will be described.

(1) Substrate

A glass plate, polymer plate and the like are preferably used as a substrate. Soda-lime glass, barium/strontium-containing glass, lead glass, aluminosilicate glass, borosilicate glass, barium borosilicate glass, quartz and the like are preferred as a glass plate. Polycarbonate, acrylic polymer, polyethylene terephthalate, polyethersulfide, polysulfone and the like are preferred as a polymer plate.

(2) Light Reflective Conductive Layer

As the material for forming a light reflective conductive layer, there can be used materials which have light reflecting properties and function as an electrode. The material preferably has a light reflectivity of 20% or more, more preferably 30% or more.

Specifically preferred is a metal selected from the group consisting of Al, Ag, Au, Pt, Cu, Mg, Cr, Mo, W, Ta, Nb, Li, Mn, Ca, Yb, Ti, Ir, Be, Hf, Eu, Sr, Ba, Cs, Na and K or alloy thereof. Particularly preferred are Pt, Au, Cr, W, Mo, Ta and Nb.

The light reflective conductive layer preferably has a thickness of 100 nm to 1 μm depending on a material used. If it is thinner than 100 nm, the light reflectivity may decrease or electric resistance may increase when used as an electrode layer. If it is thicker than 1 μm, it disadvantageously takes time for film formation.

(3) First and Second Inorganic Compound Layers

Any material which has a light transmittance of 50% or more in the wavelength region of visible light (380 nm to 780 nm) can be used for an inorganic compound layer without particular limitation. Materials with a light transmittance of 80% or more are preferred.

Inorganic compounds which have an electron injecting property and are conductive or semiconductive are preferred. Specifically the following can be given, (a) a conductive radical salt, (b) a material made of an acceptor that is a conductive oxide containing a transition metal, and a donor that is an alkali metal and/or an alkaline earth metal, and (c) a chalcogenide, and chalcogenide and alkali metal.

(a) As an example of the conductive organic radical salt, ones represented by the following formula are given:

$$D_y A_z$$

wherein D represents a molecule or an atom having a donor nature, A represents a molecule or an atom having an acceptor nature, y represents an integer of 1 to 5, and z represents an integer of 1 to 5.

D is preferably an alkali metal such as Li, K, Na, Rb or Cs, an alkaline earth metal such as Ca, and La and $NH_4$.

As A, preferred are $TaF_6$, $AsF_6$, $PF_6$, $ReO_4$, $ClO_4$, $BF_4$, $Au(CN)_2$, $Ni(CN)_4$, $CoCl_4$, $CoBr$, $I_3$, $I_2Br$, $IBr_2$, $AuI_2$, $AuBr_2$, $Cu_5I_6$, $CuCl_4$, $Cu(NCS)_2$, $FeCl_4$, $FeBr_4$, $MnCl_4$, $KHg(SCN)_4$, $Hg(SCN)_3$, $NH_4(SCN)_4$ and the like.

(b) For the material made of an acceptor that is a conductive oxide containing a transition metal, and a donor that is an alkali metal and/or an alkaline earth metal, preferred acceptors are at least one oxide selected from the group of $Li_xTi_2O_4$, $Li_xV_2O_4$, $Er_xNbO_3$, $La_xTiO_3$, $Sr_xVO_3$, $Ca_xCrO_3$, $Sr_xCrO_3$, $A_xMoO_3$, $AV_2O_5$ wherein A is K, Cs, Rb, Sr, Na, Li or Ca, and x is 0.2 to 5.

As the alkali metal and alkaline earth metal, the above-mentioned D is preferred.

(c) As the chalcogenide, preferred are ZnSe, ZnS, TaS, TaSe, ZnO and the like. Materials made of chalcogenide and alkali metal are also preferred. Preferred examples include LiZnSe, LiZnSi, LiZnO and LiInO.

An inorganic oxide may also be preferably used. As examples of the inorganic oxide, oxides of In, Sn, Zn, Ce, Sm, Pr, Nd, Tb, Cd, Ga, Al, Mo, W, and the like can be given. Of these, an oxide containing In, Sn, or Zn is preferable.

It is preferable that the materials used for the light reflective conductive layer, the first inorganic compound layer, and the second inorganic compound layer differ in etching properties in order to facilitate production of the display. Specifically, it is preferable to select a material which is easily etched in the order from the second inorganic compound layer, the first inorganic compound layer, and the light reflective conductive layer.

For example, a material which is etched using a weaker acid than that used for the material for the light reflective conductive layer is selected for the first inorganic compound layer, and a material which is etched using a weaker acid than that used for the material for the first inorganic compound layer is selected for the second inorganic compound layer.

Note that a material which allows each layer to be selectively etched using a specific etchant may be selected.

In order to allow the first inorganic compound layer and the second inorganic compound layer to differ in etching properties, the crystallinity of the inorganic oxides which form these compound layers may be adjusted. The compound layer tends to be less etched using an acid as the crystallinity of the compound layer becomes higher.

In the invention, the first inorganic compound layer and the second inorganic compound layer may be allowed to differ in etching properties by setting the crystallinity of the first inorganic compound layer to be higher than the crystallinity of the second inorganic compound layer.

As an example utilizing the difference in etching properties, an example using wet etching is given below.

A Cr film is formed on a glass substrate by sputtering to form a light reflective conductive layer. The substrate is subjected to etching using a mixture of ceric ammonium nitrate-hydrogen peroxide aqueous solution (CAN) to obtain a substrate provided with the light reflective conductive layer with a desired pattern.

An ITO film is formed by sputtering and etched using an oxalic acid aqueous solution to obtain a substrate provided with the amorphous (noncrystalline) ITO film with a desired pattern.

The substrate is heated at 230° C. for 30 minutes to obtain a substrate provided with the crystalline ITO film (first inorganic compound layer). A layer which is not etched using an oxalic acid aqueous solution can be formed by forming the crystalline ITO film.

An IZO film is formed on the ITO film (substrate) by sputtering and etched using an oxalic acid aqueous solution to obtain a substrate provided with a second inorganic compound layer with a desired pattern. Noncrystalline ITO may also be used for the second inorganic compound layer.

The crystallinity may be determined by X-ray diffraction measurement. Specifically, X-rays are applied to the surface of the sample, and the angle (2θ) and the intensity of the diffraction line are measured. The crystallinity is determined from the integrated intensity ratio of the diffraction peaks.

It is also preferable that the first inorganic compound layer be crystalline and the second inorganic compound layer be noncrystalline. This allows the second inorganic compound layer to be easily etched using a weaker acid than that used for the first inorganic compound layer.

As examples of the inorganic compound which is easily etched using a weak acid, indium zinc oxide (IZO), a material obtained by adding a lanthanoid metal oxide to IZO, and the like can be given. As examples of the lanthanoid metal oxide, cerium oxide, praseodymium oxide, neodymium oxide, samarium oxide, europium oxide, gadolinium oxide, terbium oxide, dysprosium oxide, holmium oxide, erbium oxide, thulium oxide, ytterbium oxide, lutetium oxide, and the like can be given.

The content of the lanthanoid metal oxide is preferably 0.1 to 10 atom percent of the total metal atoms of the metal oxide in the metal oxide layer.

It is also preferable to use noncrystalline indium tin oxide (ITO) obtained by sputtering ITO in the presence of hydrogen or the like.

As examples of the material which can be easily etched using a weaker acid than that for the light reflective conductive layer and is etched to a smaller extent than the above inorganic compound, ITO, an indium oxide-cerium oxide compound, an indium oxide-tungsten oxide compound, an indium oxide-molybdenum oxide compound, and the like can be given. Noncrystalline ITO and a noncrystalline substance of the above compound are also preferable. Since noncrystalline ITO and a noncrystalline substance of the above compound can be converted into a crystalline compound by thermal annealing, as described above, these compounds are particularly suitable when forming the second inorganic compound layer on the first inorganic compound layer.

It is preferable to form the first inorganic compound layer using ITO and form the second inorganic compound layer using IZO, since damage to the underlayer can be reduced during etching.

The thicknesses of the first inorganic compound layer and the second inorganic compound layer may be appropriately adjusted so that light having a desired wavelength resonates in the resonator of each EL device part. The thicknesses of the first inorganic compound layer and the second inorganic compound layer are preferably 5 to 1000 nm.

(4) Organic Luminescent Medium Layer

An organic luminescent medium layer is a single layer and stacked layers containing at least an emitting layer. For example, the following configurations are given.

(i) Emitting layer/hole-injecting layer
(ii) Emitting layer/hole-transporting layer/hole-injecting layer
(iii) Electron-injecting layer/emitting layer/hole-injecting layer
(iv) Electron-injecting layer/emitting layer/hole-transporting layer/hole-injecting layer
(v) Electron-injecting layer/electron-transporting layer/emitting layer/hole-injecting layer
(vi) Electron-injecting layer/electron-transporting layer/emitting layer/hole-transporting layer/hole-injecting layer (4-1) Emitting Layer As methods of forming an emitting layer, known methods such as deposition, spin coating and LB technique can be applied. As disclosed in JP-A-57-51781, the emitting layer can also be formed by dissolving a binder such as resins and material compound in a solvent to make a solution and forming a thin film therefrom by spin coating and so on.

An emitting layer may be formed of plural layers emitting light in different colors. For example, white emission can be obtained by stacking a blue emitting layer and an orange emitting layer. A layer containing two or more luminescent materials can also be used as an emitting layer. In this case, the emitting layer may be single or multi-layered.

The materials used in the emitting layer can be a material known as a luminescent material having a long lifetime. Fluorescent or phosphorescent materials are used in general. Phosphorescent materials are preferred due to their excellent luminous efficiency. As an example, fluorescent materials will be described below.

It is preferred to use, as the luminescent material, a material represented by the formula (1).

$$(Ar^1)_l-(X)_m \quad (1)$$

wherein $Ar^1$ is an aromatic ring with 6 to 50 nucleus carbon atoms, X is a substituent, l is an integer of 1 to 5, and m is an integer of 0 to 6.

Specific examples of $Ar^1$ include phenyl, naphthyl, anthracene, biphenylene, azulene, acenaphthylene, fluorene, phenanthrene, fluoranthene, acephenanthrylene, triphenylene, pyrene, chrysene, naphthacene, picene, perylene, pentaphene, pentacene, tetraphenylene, hexaphene, hexacene, rubicene, coronene, and trinaphthylene rings.

Preferred examples thereof include phenyl, naphthyl, anthracene, acenaphthylene, fluorene, phenanthrene, fluoranthene, triphenylene, pyrene, chrysene, perylene, and trinaphthylene rings.

More preferred examples thereof include phenyl, naphthyl, anthracene, fluorene, phenanthrene, fluoranthene, pyrene, chrysene, and perylene rings.

Specific examples of X include substituted or unsubstituted aromatic groups with 6 to 50 nucleus carbon atoms, substituted or unsubstituted aromatic heterocyclic groups with 5 to 50 nucleus carbon atoms, substituted or unsubstituted alkyl groups with 1 to 50 carbon atoms, substituted or unsubstituted alkoxy groups with 1 to 50 carbon atoms, substituted or unsubstituted aralkyl groups with 1 to 50 carbon atoms, substituted or unsubstituted aryloxy groups with 5 to 50 nucleus atoms, substituted or unsubstituted arylthio groups with 5 to 50 nucleus atoms, substituted or unsubstituted carboxyl groups with 1 to 50 carbon atoms, substituted or unsubstituted styryl groups, halogen groups, a cyano group, a nitro group, and a hydroxyl group.

Examples of the substituted or unsubstituted aromatic groups with 6 to 50 nucleus carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-fluorenyl, 9,9-dimethyl-2-fluorenyl and 3-fluorantenyl groups.

Preferred examples thereof include phenyl, 1-naphthyl, 2-naphthyl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, o-tolyl, m-tolyl, p-tolyl, p-t-butylphenyl, 2-fluorenyl, 9,9-dimethyl-2-fluorenyl and 3-fluorantenyl groups.

Examples of the substituted or unsubstituted aromatic heterocyclic groups with 5 to 50 nucleus carbon atoms include 1-pyrrolyl, 2-pyrrolyl, 3-pyrrolyl, pyrazinyl, 2-pyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acrydinyl, 2-acrydinyl, 3-acrydinyl, 4-acrydinyl, 9-acrydinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 10-phenothiazinyl, 1-phenoxazinyl, 2-phenoxazinyl, 3-phenoxazinyl, 4-phenoxazinyl, 10-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl 1-indolyl, 4-t-butyl 1-indolyl, 2-t-butyl 3-indolyl, and 4-t-butyl 3-indolyl groups.

Examples of the substituted or unsubstituted alkyl groups with 1 to 50 carbon atoms include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihydroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, 1,2,3-trinitropropyl, cyclopropyl, cyclobutyl, cyclopentyl, cyclohexyl, 4-methylcyclohexyl, 1-adamanthyl, 2-adamanthyl, 1-norbornyl, and 2-norbornyl groups.

The substituted or unsubstituted alkoxy groups with 1 to 50 carbon atoms are groups represented by —OY. Examples of Y include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihyroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, and 1,2,3-trinitropropyl groups.

Examples of the substituted or unsubstituted aralkyl groups with 1 to 50 carbon atoms include benzyl, 1-phenylethyl, 2-phenylethyl, 1-phenylisopropyl, 2-phenylisopropyl, phenyl-t-butyl, α-naphthylmethyl, 1-α-naphthylethyl, 2-α-naphthylethyl, 1-α-naphthylisopropyl, 2-α-naphthylisopropyl, β-naphthylmethyl, 1-β-naphthylethyl, 2-β-naphthylethyl, 1-β-naphthylisopropyl, 2-β-naphthylisopropyl, 1-pyrrolylmethyl, 2-(1-pyrrolyl)ethyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl groups.

The substituted or unsubstituted aryloxy groups with 5 to 50 nucleus atoms are represented by —OY'. Examples of Y' include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-pyrrolyl, 3-pyrrolyl, pyrazinyl, 2-pyridinyl, 3-pyridinyl, 4-pyridinyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acrydinyl, 2-acrydinyl, 3-acrydinyl, 4-acrydinyl, 9-acrydinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline-3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl 1-indolyl, 4-t-butyl 1-indolyl, 2-t-butyl 3-indolyl, and 4-t-butyl 3-indolyl groups.

The substituted or unsubstituted arylthio groups with 5 to 50 nucleus atoms are represented by —SY", and examples of Y" include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4"-t-butyl-p-terphenyl-4-yl, 2-pyrrolyl, 3-pyrrolyl, pyrazinyl, 2-pyridinyl, 3-pyridinyl, 4-pyridinyl, 2-indolyl, 3-indolyl, 4-indolyl, 5-indolyl, 6-indolyl, 7-indolyl, 1-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 1-phenanthrydinyl, 2-phenanthrydinyl, 3-phenanthrydinyl, 4-phenanthrydinyl, 6-phenanthrydinyl, 7-phenanthrydinyl, 8-phenanthrydinyl, 9-phenanthrydinyl, 10-phenanthrydinyl, 1-acrydinyl, 2-acrydinyl, 3-acrydinyl, 4-acrydinyl, 9-acrydinyl, 1,7-phenanthroline-2-yl, 1,7-phenanthroline-3-yl, 1,7-phenanthroline-4-yl, 1,7-phenanthroline-5-yl, 1,7-phenanthroline-6-yl, 1,7-phenanthroline-8-yl, 1,7-phenanthroline-9-yl, 1,7-phenanthroline-10-yl, 1,8-phenanthroline-2-yl, 1,8-phenanthroline-3-yl, 1,8-phenanthroline-4-yl, 1,8-phenanthroline-5-yl, 1,8-phenanthroline-6-yl, 1,8-phenanthroline-7-yl, 1,8-phenanthroline-9-yl, 1,8-phenanthroline-10-yl, 1,9-phenanthroline-2-yl, 1,9-phenanthroline-3-yl, 1,9-phenanthroline-4-yl, 1,9-phenanthroline-5-yl, 1,9-phenanthroline-6-yl, 1,9-phenanthroline-7-yl, 1,9-phenanthroline-8-yl, 1,9-phenanthroline-10-yl, 1,10-phenanthroline-2-yl, 1,10-phenanthroline, 3-yl, 1,10-phenanthroline-4-yl, 1,10-phenanthroline-5-yl, 2,9-phenanthroline-1-yl, 2,9-phenanthroline-3-yl, 2,9-phenanthroline-4-yl, 2,9-phenanthroline-5-yl, 2,9-phenanthroline-6-yl, 2,9-phenanthroline-7-yl, 2,9-phenanthroline-8-yl, 2,9-phenanthroline-10-yl, 2,8-phenanthroline-1-yl, 2,8-phenanthroline-3-yl, 2,8-phenanthroline-4-yl, 2,8-phenanthroline-5-yl, 2,8-phenanthroline-6-yl, 2,8-phenanthroline-7-yl, 2,8-phenanthroline-9-yl, 2,8-phenanthroline-10-yl, 2,7-phenanthroline-1-yl, 2,7-phenanthroline-3-yl, 2,7-phenanthroline-4-yl, 2,7-phenanthroline-5-yl, 2,7-phenanthroline-6-yl, 2,7-phenanthroline-8-yl, 2,7-phenanthroline-9-yl, 2,7-phenanthroline-10-yl, 1-phenazinyl, 2-phenazinyl, 1-phenothiazinyl, 2-phenothiazinyl, 3-phenothiazinyl, 4-phenothiazinyl, 1-phenoxazinyl, 2-phenoxazinyl, 3-phenoxazinyl, 4-phenoxazinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrole-1-yl, 2-methylpyrrole-3-yl, 2-methylpyrrole-4-yl, 2-methylpyrrole-5-yl, 3-methylpyrrole-1-yl, 3-methylpyrrole-2-yl, 3-methylpyrrole-4-yl, 3-methylpyrrole-5-yl, 2-t-butylpyrrole-4-yl, 3-(2-phenylpropyl)pyrrole-1-yl, 2-methyl-1-indolyl, 4-methyl-1-indolyl, 2-methyl-3-indolyl, 4-methyl-3-indolyl, 2-t-butyl 1-indolyl, 4-t-butyl 1-indolyl, 2-t-butyl 3-indolyl, and 4-t-butyl 3-indolyl groups.

The substituted or unsubstituted carboxyl groups with 1 to 50 carbon atoms are represented by —COOZ, and examples of Z include methyl, ethyl, propyl, isopropyl, n-butyl, s-butyl, isobutyl, t-butyl, n-pentyl, n-hexyl, n-heptyl, n-octyl, hydroxymethyl, 1-hydroxyethyl, 2-hydroxyethyl, 2-hydroxyisobutyl, 1,2-dihydroxyethyl, 1,3-dihydroxyisopropyl, 2,3-dihyroxy-t-butyl, 1,2,3-trihydroxypropyl, chloromethyl, 1-chloroethyl, 2-chloroethyl, 2-chloroisobutyl, 1,2-dichloroethyl, 1,3-dichloroisopropyl, 2,3-dichloro-t-butyl, 1,2,3-trichloropropyl, bromomethyl, 1-bromoethyl, 2-bromoethyl, 2-bromoisobutyl, 1,2-dibromoethyl, 1,3-dibromoisopropyl, 2,3-dibromo-t-butyl, 1,2,3-tribromopropyl, iodomethyl, 1-iodoethyl, 2-iodoethyl, 2-iodoisobutyl, 1,2-diiodoethyl, 1,3-diiodoisopropyl, 2,3-diiodo-t-butyl, 1,2,3-triiodopropyl, aminomethyl, 1-aminoethyl, 2-aminoethyl, 2-aminoisobutyl, 1,2-diaminoethyl, 1,3-diaminoisopropyl, 2,3-diamino-t-butyl, 1,2,3-triaminopropyl, cyanomethyl, 1-cyanoethyl, 2-cyanoethyl, 2-cyanoisobutyl, 1,2-dicyanoethyl, 1,3-dicyanoisopropyl, 2,3-dicyano-t-butyl, 1,2,3-tricyanopropyl, nitromethyl, 1-nitroethyl, 2-nitroethyl, 2-nitroisobutyl, 1,2-dinitroethyl, 1,3-dinitroisopropyl, 2,3-dinitro-t-butyl, and 1,2,3-trinitropropyl groups.

Examples of the substituted or unsubstituted styryl groups include 2-phenyl-1-vinyl, 2,2-diphenyl-1-vinyl, and 1,2,2-triphenyl-1-vinyl groups.

Examples of the halogen groups include fluorine, chlorine, bromine and iodine.

l is an integer of 1 to 5, preferably 1 to 2. m is an integer of 0 to 6, preferably 0 to 4.

$Ar^1$s may be the same as or different from each other when l is 2 or more, and Xs may be the same as or different from each other when m is 2 or more.

Specific examples of the compounds represented by the formula (1) are illustrated below.

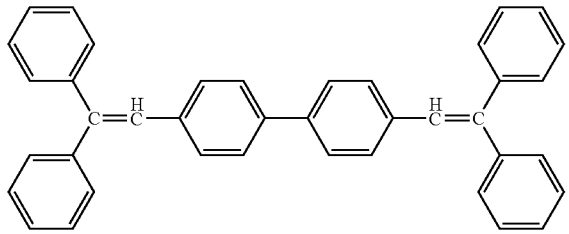

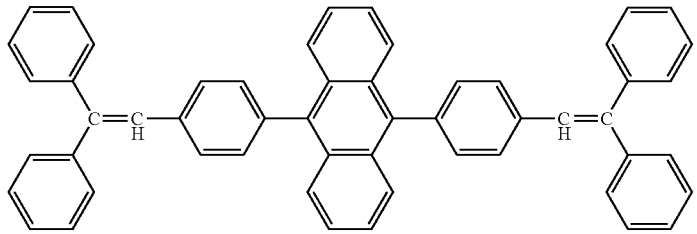

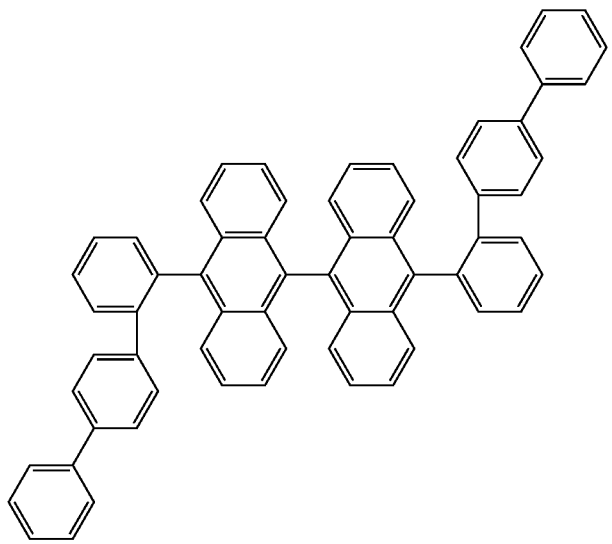

-continued
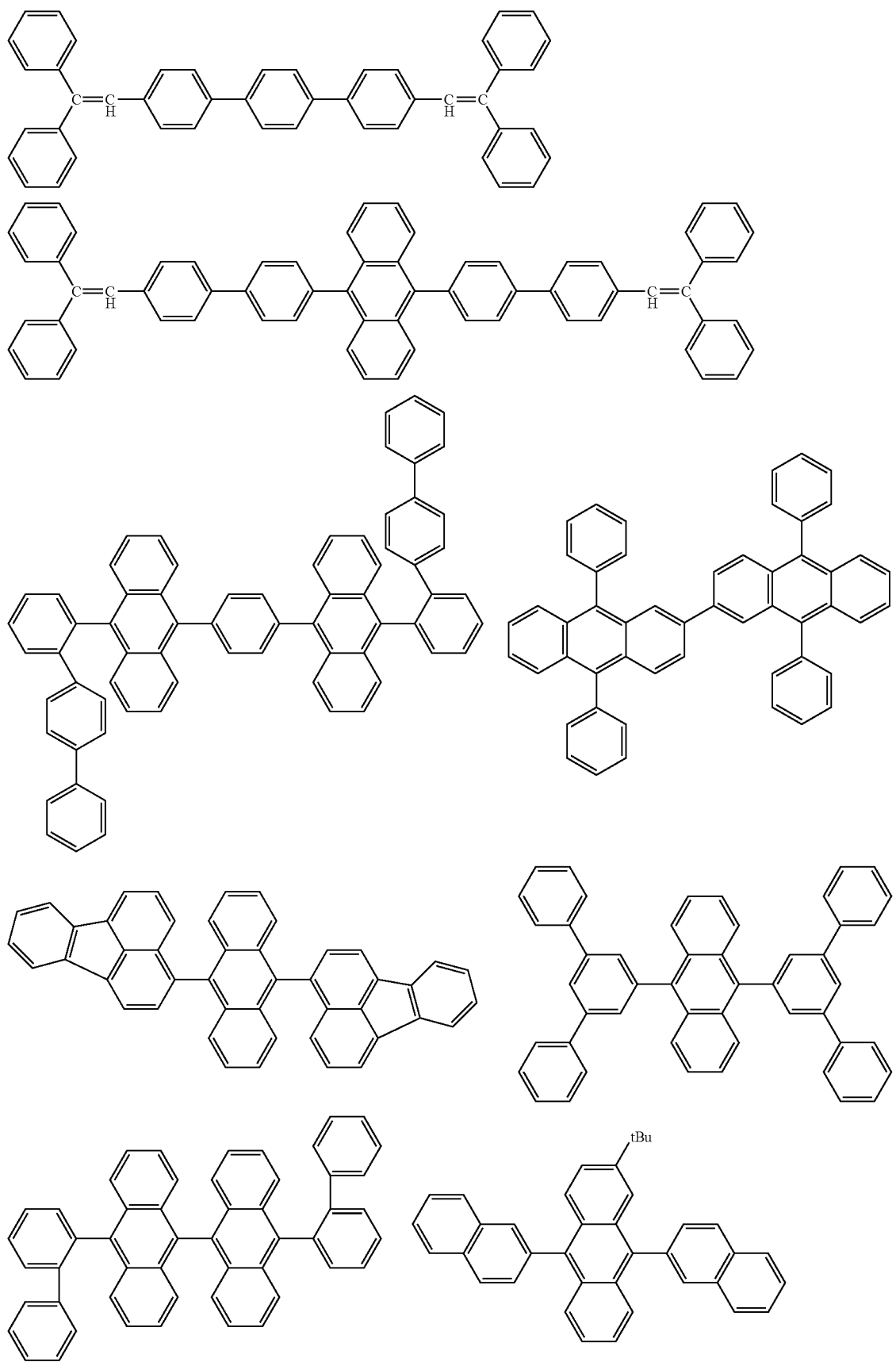

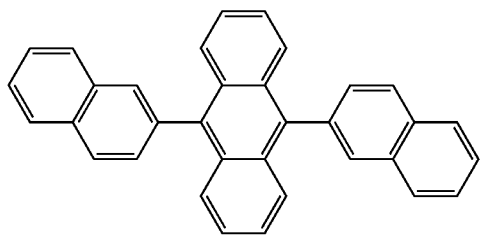
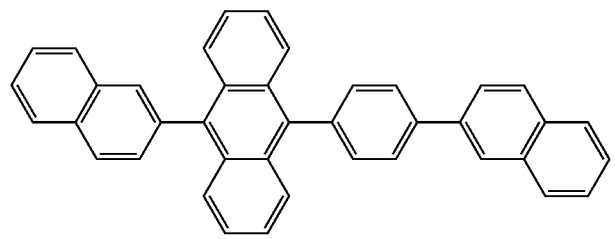

In the emitting layer, its emission capability can be improved by adding a fluorescent compound as a dopant. The dopant may be a dopant known as a luminescent material having a long lifetime. It is preferred to use, as the dopant material of the luminescent material, a material represented by the formula (2):

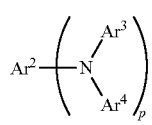
(2)

wherein $Ar^2$ to $Ar^4$ are each a substituted or unsubstituted aromatic group with 6 to 50 nucleus carbon atoms, or a substituted or unsubstituted styryl group; and p is an integer of 1 to 4.

Examples of the substituted or unsubstituted aromatic group with 6 to 50 nucleus carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-t-butylphenyl, p-(2-phenylpropyl)phenyl, 3-methyl-2-naphthyl, 4-methyl-1-naphthyl, 4-methyl-1-anthryl, 4'-methylbiphenylyl, 4''-t-butyl-p-terphenyl-4-yl, 2-fluorenyl, 9,9-dimethyl-2-fluorenyl and 3-fluorantenyl groups.

Preferred examples thereof include phenyl, 1-naphthyl, 2-naphthyl, 9-phenanthryl, 1-naphthacenyl, 2-naphthacenyl, 9-naphthacenyl, 1-pyrenyl, 2-pyrenyl, 4-pyrenyl, 2-biphenylyl, 3-biphenylyl, 4-biphenylyl, o-tolyl, m-tolyl, p-tolyl, p-t-butylphenyl, 2-fluorenyl, 9,9-dimethyl-2-fluorenyl and 3-fluorantenyl groups.

Examples of the substituted or unsubstituted styryl group include 2-phenyl-1-vinyl, 2,2-diphenyl-1-vinyl, and 1,2,2-triphenyl-1-vinyl groups.

p is an integer of 1 to 4; provided that $Ar^3$s, as well as $Ar^4$s, may be the same as or different from each other when p is 2 or more.

Specific examples of the compounds represented by the formula (2) are illustrated below.

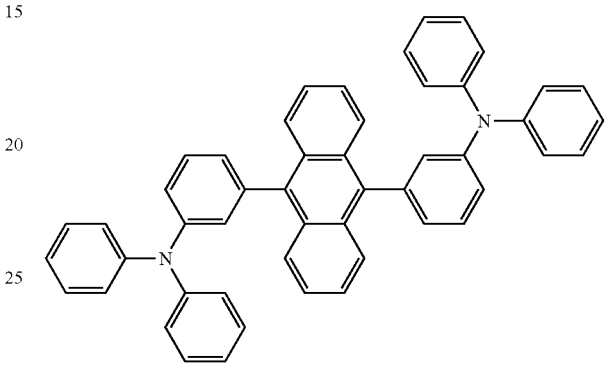
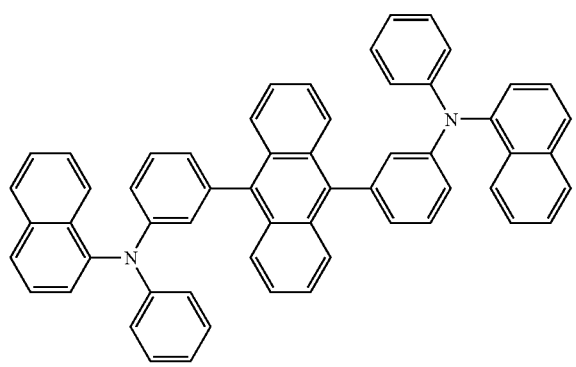
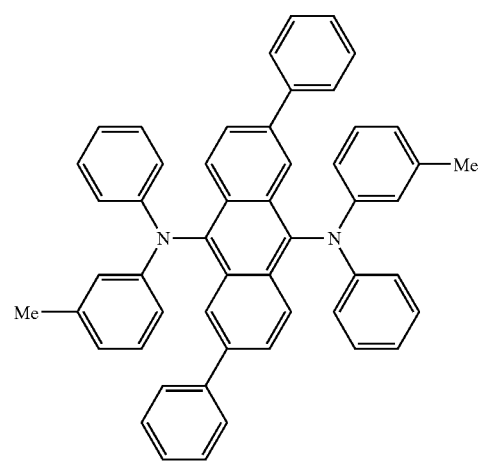

-continued
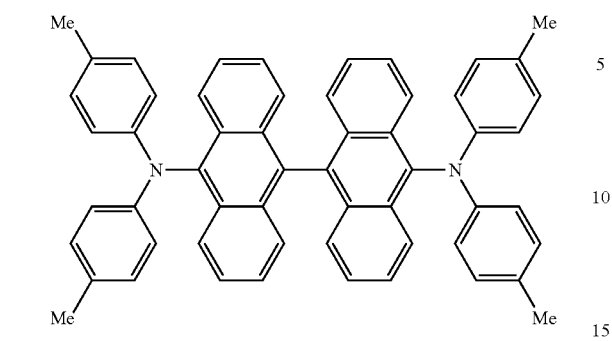
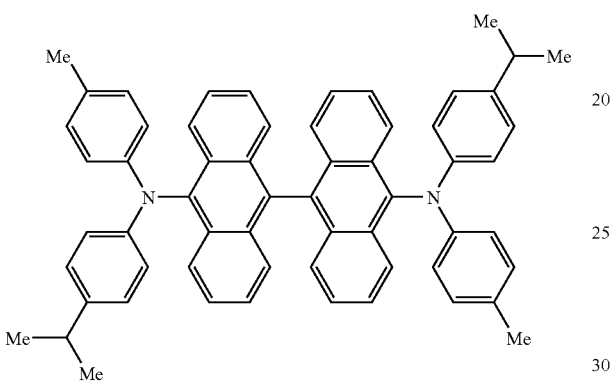
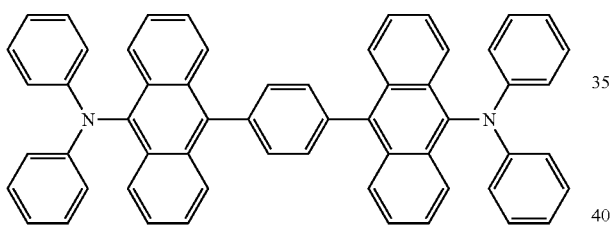
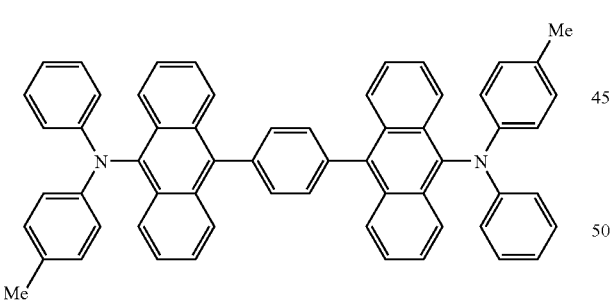
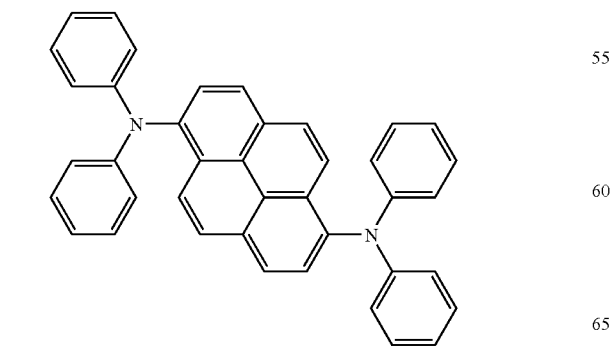
-continued
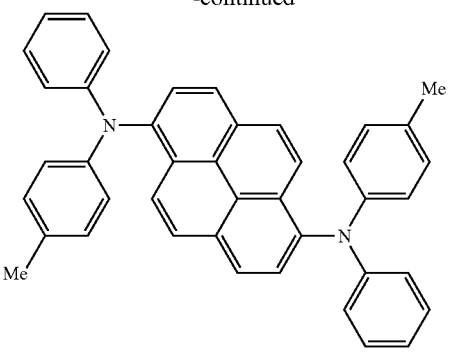
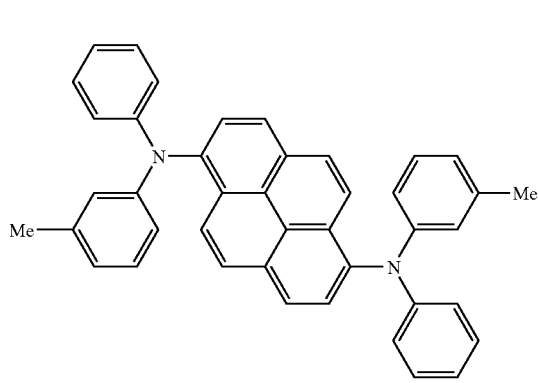
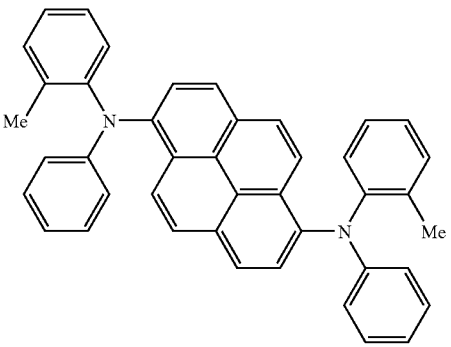
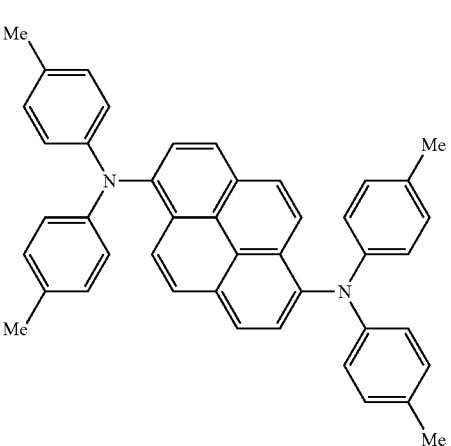

-continued
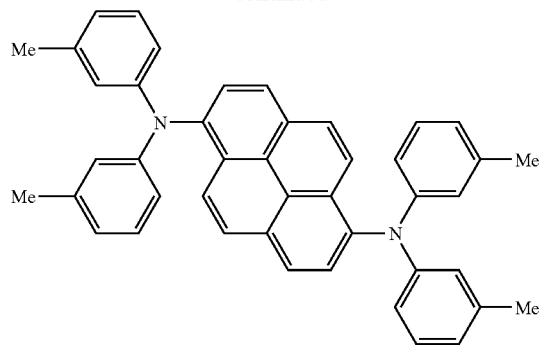
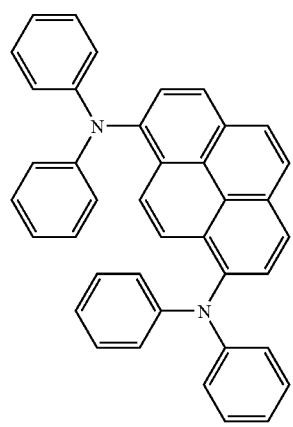
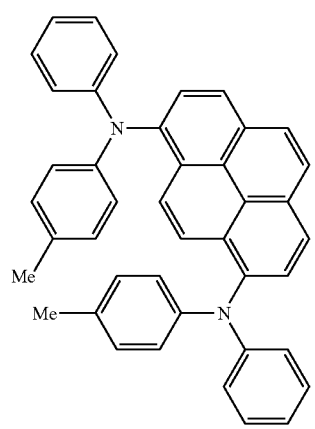
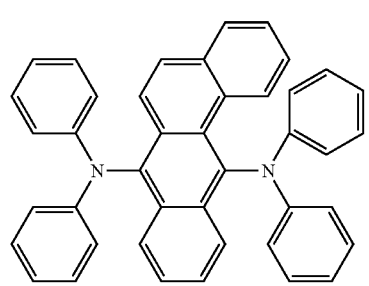
-continued
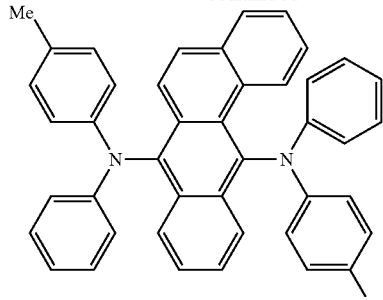
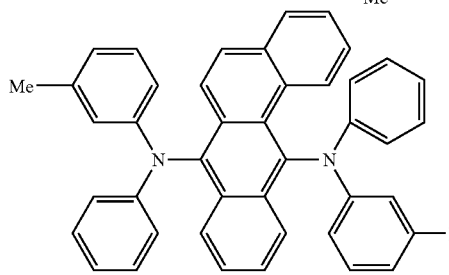
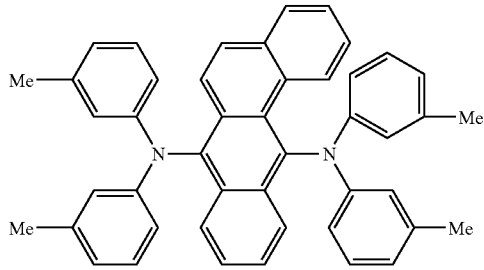
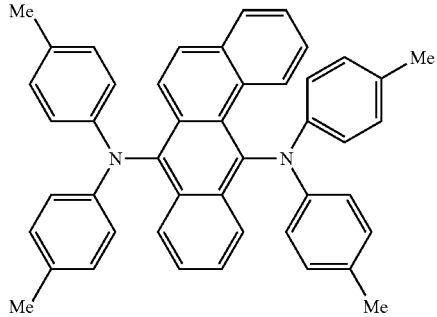
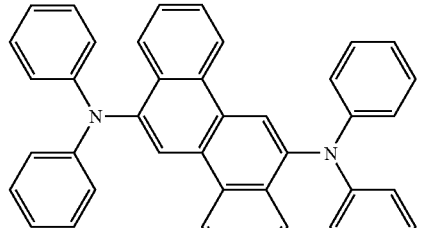
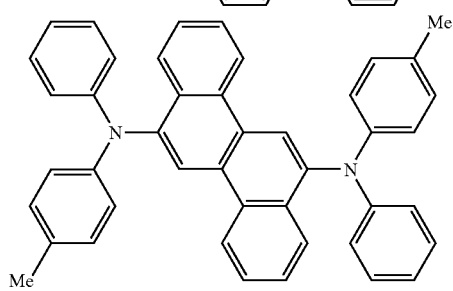

-continued
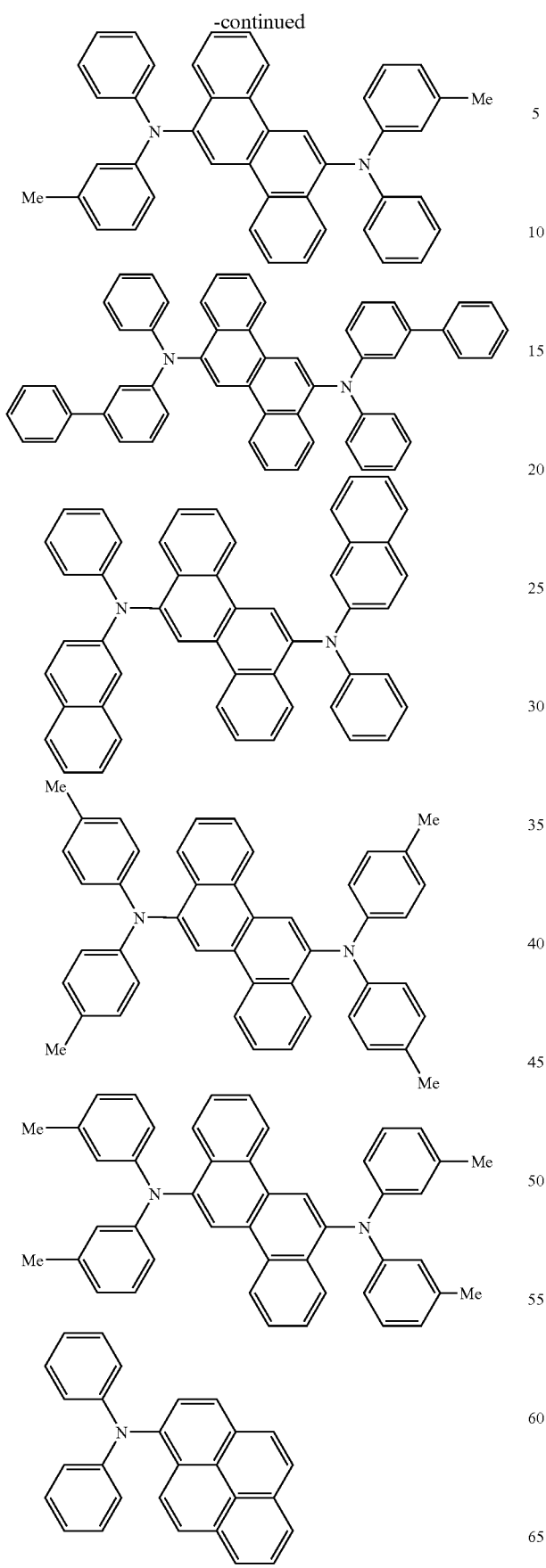
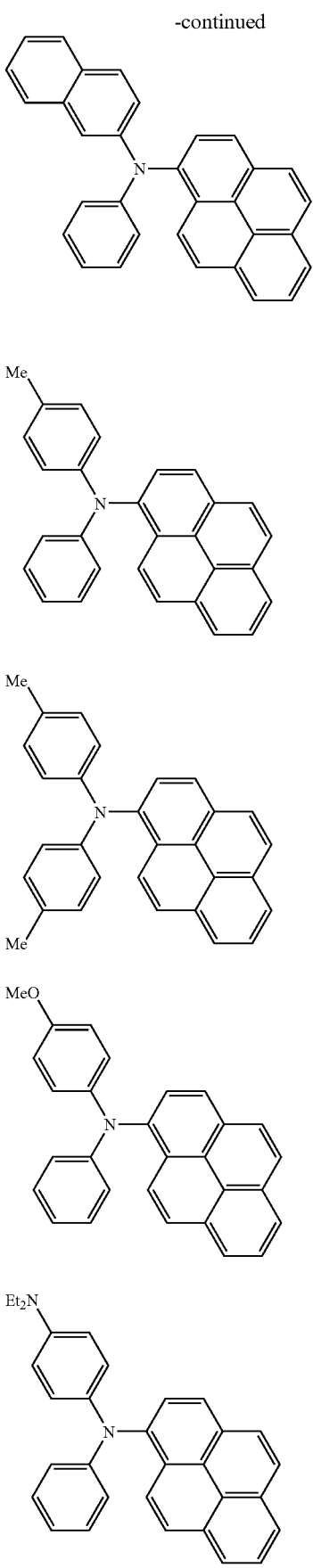

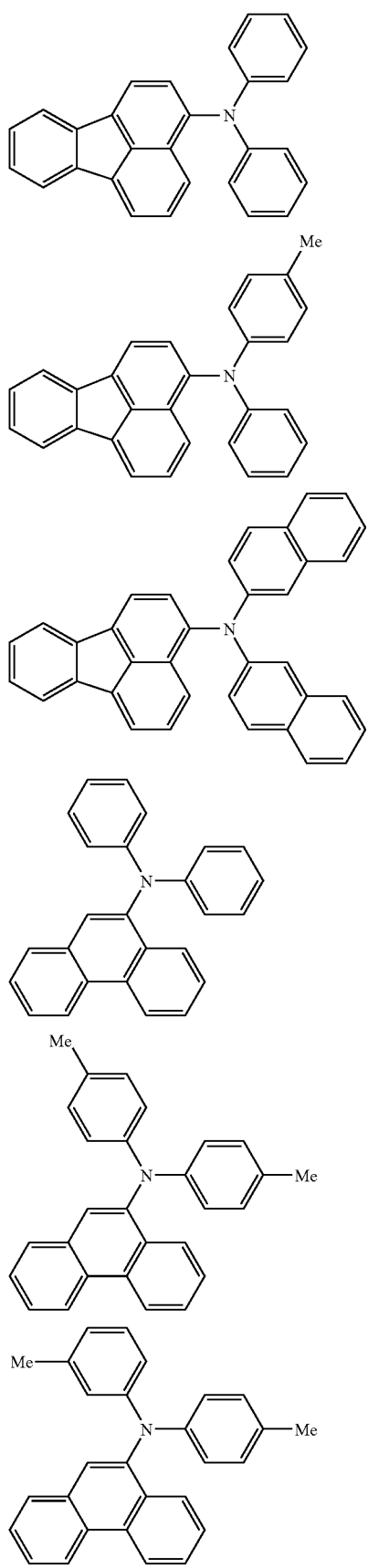
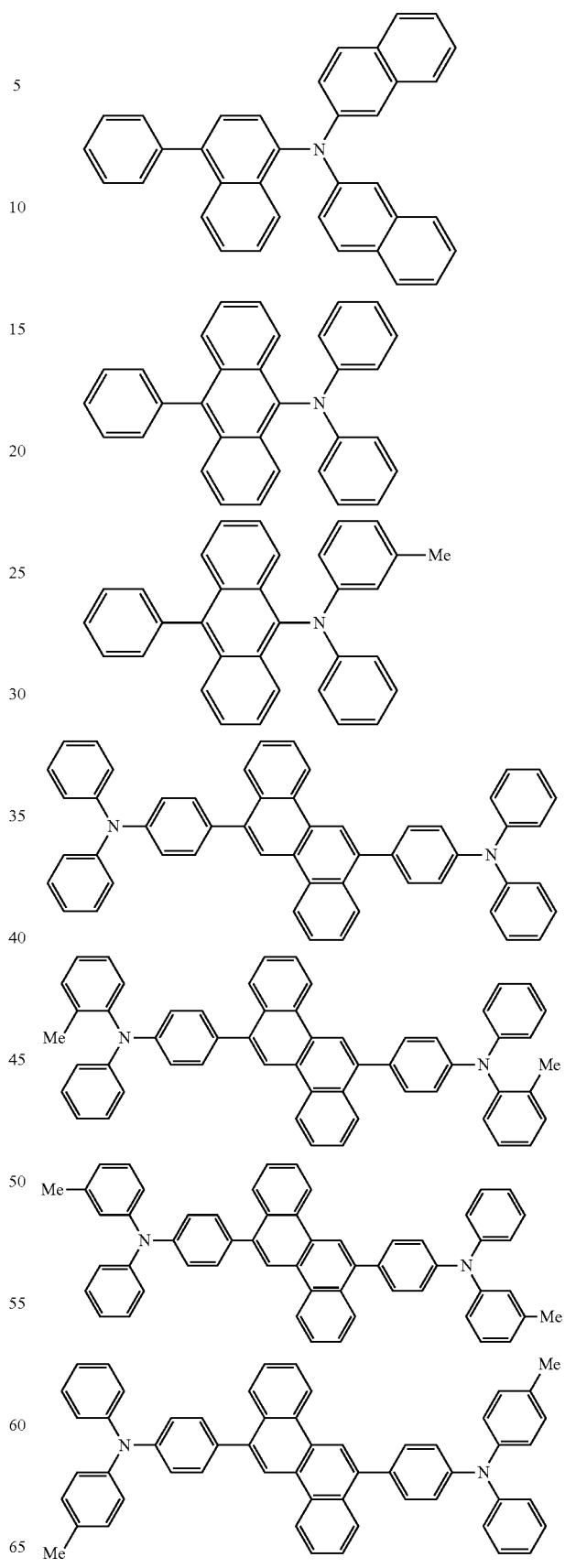

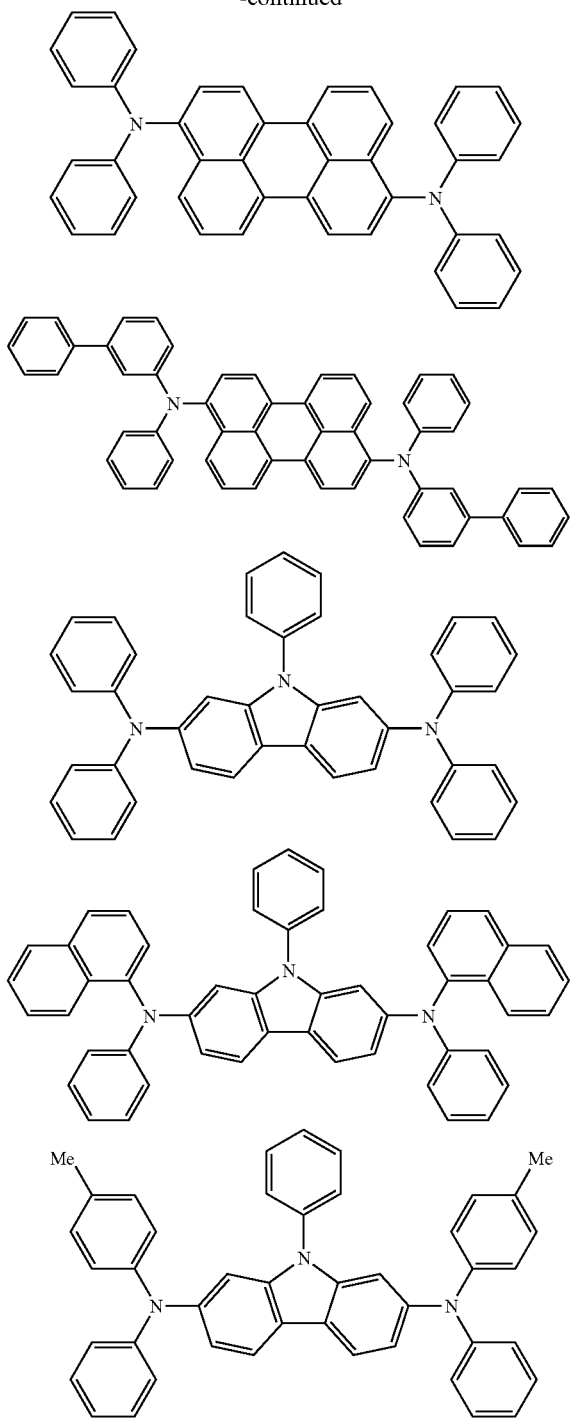

(4-2) Hole-Transporting Layer

In the invention, a hole-transporting layer may be provided between an emitting layer and a hole-injecting layer. The hole-transporting layer is preferably made of a material that can transport holes to the emitting layer at a lower electric field intensity. Namely, the hole mobility thereof is preferably $10^{-4}$ cm$^2$/V·second or more when an electric field of $10^4$ to $10^6$ V/cm is applied.

The material for forming the hole-transporting layer can be arbitrarily selected from materials which have been widely used as a hole-transporting material among photoconductive materials and known materials used in a hole-transporting layer of organic EL devices.

Specific examples thereof include triazole derivatives (see U.S. Pat. No. 3,112,197 and others), oxadiazole derivatives (see U.S. Pat. No. 3,189,447 and others), imidazole derivatives (see JP-B-37-16096 and others), polyarylalkane derivatives (see U.S. Pat. Nos. 3,615,402, 3,820,989 and 3,542,544, JP-B-45-555 and 51-10983, JP-A-51-93224, 55-17105, 56-4148, 55-108667, 55-156953 and 56-36656, and others), pyrozoline derivatives and pyrozolone derivatives (see U.S. Pat. Nos. 3,180,729 and 4,278,746, JP-A-55-88064, 55-88065, 49-105537, 55-51086, 56-80051, 56-88141, 57-45545, 54-112637 and 55-74546, and others), phenylene diamine derivatives (see U.S. Pat. No. 3,615,404, JP-B-51-10105, 46-3712 and 47-25336, JP-A-54-53435, 54-110536 and 54-119925, and others), arylamine derivatives (see U.S. Pat. Nos. 3,567,450, 3,180,703, 3,240,597, 3,658,520, 4,232,103, 4,175,961 and 4,012,376, JP-B-49-35702 and 39-27577, JP-A-55-144250, 56-119132 and 56-22437, DE1,110,518, and others), amino-substituted chalcone derivatives (see U.S. Pat. No. 3,526,501, and others), oxazole derivatives (ones disclosed in U.S. Pat. No. 3,257,203, and others), styrylanthracene derivatives (see JP-A-56-46234, and others), fluorenone derivatives (JP-A-54-110837, and others), hydrazone derivatives (see U.S. Pat. Nos. 3,717,462, JP-A-54-59143, 55-52063, 55-52064, 55-46760, 55-85495, 57-11350, 57-148749 and 2-311591, and others), stylbene derivatives (see JP-A-61-210363, 61-228451, 61-14642, 61-72255, 62-47646, 62-36674, 62-10652, 62-30255, 60-93455, 60-94462, 60-174749 and 60-175052, and others), silazane derivatives (U.S. Pat. No. 4,950,950), polysilanes (JP-A-2-204996), aniline copolymers (JP-A-2-282263), and electroconductive macromolecular oligomers (in particular thiophene oligomers) disclosed in JP-A-1-211399.

The hole-transporting layer can be formed from the above-mentioned compounds by a known method such as vacuum deposition, spin coating, casting or LB technique. The thickness of hole-transporting layer is not particularly limited, and is preferably from 5 nm to 5 μm, more preferably from 5 nm to 40 nm. The hole-transporting layer may be a single layer made of one or more out of the above-mentioned materials. The layer may be stacked hole-transporting layers made of different compounds.

(4-3) Hole-Injecting Layer

The same substances as those used for the hole-transporting layer can be used as the material of the hole-injecting layer. The following is preferably used: porphyrin compounds (disclosed in JP-A-63-2956965 and others), aromatic tertiary amine compounds and styrylamine compounds (see U.S. Pat. Nos. 4,127,412, JP-A-53-27033, 54-58445, 54-149634, 54-64299, 55-79450, 55-144250, 56-119132, 61-295558, 61-98353 and 63-295695, and others), in particular, the aromatic tertiary amine compounds.

The following can also be given as examples: 4,4'-bis(N-(1-naphthyl)-N-phenylamino)biphenyl (hereinafter referred to as NPD), which has in the molecule thereof two condensed aromatic rings, disclosed in U.S. Pat. Nos. 5,061,569, and 4,4',4''-tris(N-(3-methylphenyl)-N-phenylamino)triphenylamine (hereinafter referred to as hereinafter referred to as MTDATA), wherein three triphenylamine units are linked in a star-burst form, disclosed in JP-A-4-308688.

Inorganic compound such as p-type Si and p-type SiC, as well as the aromatic dimethylidene type compounds can also be used as the material of the hole-injecting layer. The organic semiconductor layer, which is also a hole-injecting layer, is a layer for helping the injection of holes or electrons into the emitting layer, and is preferably a layer having an electroconductivity of $10^{-10}$ S/cm or more. The material of such an organic semiconductor layer may be an electroconductive oligomer such as thiophene-containing oligomers or arylamine-containing oligomers disclosed in JP-A-8-193191, or an electroconductive dendrimer such as arylamine-containing dendrimers.

The hole-injecting layer can be formed from the above-mentioned compounds by a known method such as vacuum deposition, spin coating, casting or LB technique.

The thickness of the hole-injecting layer is preferably 40 nm to 1000 nm in order to avoid damage during the formation of an anode. It is more preferably 60 to 300 nm, still more preferably 100 to 200 nm.

The hole-injecting layer may be a single layer made of one kind or two or more kinds of the above-mentioned materials. The hole-injecting layer may be stacked hole-injecting layers made of different compounds.

(4-4) Electro-Transporting Layer

In the invention, an electron-transporting layer may be provided between the cathode and the emitting layer.

The thickness of electron-transporting layer may be properly selected from several nm to several μm but is preferably selected such that the electron mobility is $10^{-5}$ cm$^2$/Vs or more when an electric field of $10^4$ to $10^6$ V/cm is applied.

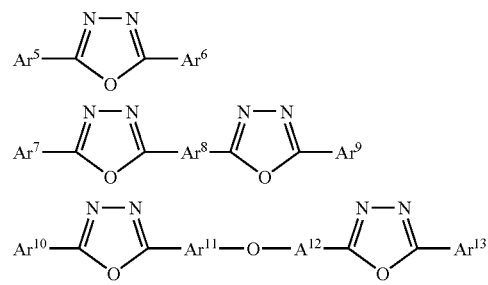

wherein $Ar^5$, $Ar^6$, $Ar^7$, $Ar^9$, $Ar^{10}$ and $Ar^{13}$ each represent a substituted or unsubstituted aryl group and may be the same or different, and $Ar^8$, $Ar^{11}$ and $Ar^{12}$ represent a substituted or unsubstituted arylene group and may be the same or different.

Examples of the aryl group include phenyl, biphenyl, anthranyl, perylenyl, and pyrenyl groups. Examples of the arylene group include phenylene, naphthylene, biphenylene, anthranylene, perylenylene, and pyrenylene groups. Examples of the substituent include alkyl groups with 1 to 10 carbon atoms, alkoxy groups with 1 to 10 carbon atoms, and a cyano group. The electron-transferring compounds are preferably ones having capability of forming a thin film.

Specific examples of the electron-transferring compounds include the following.

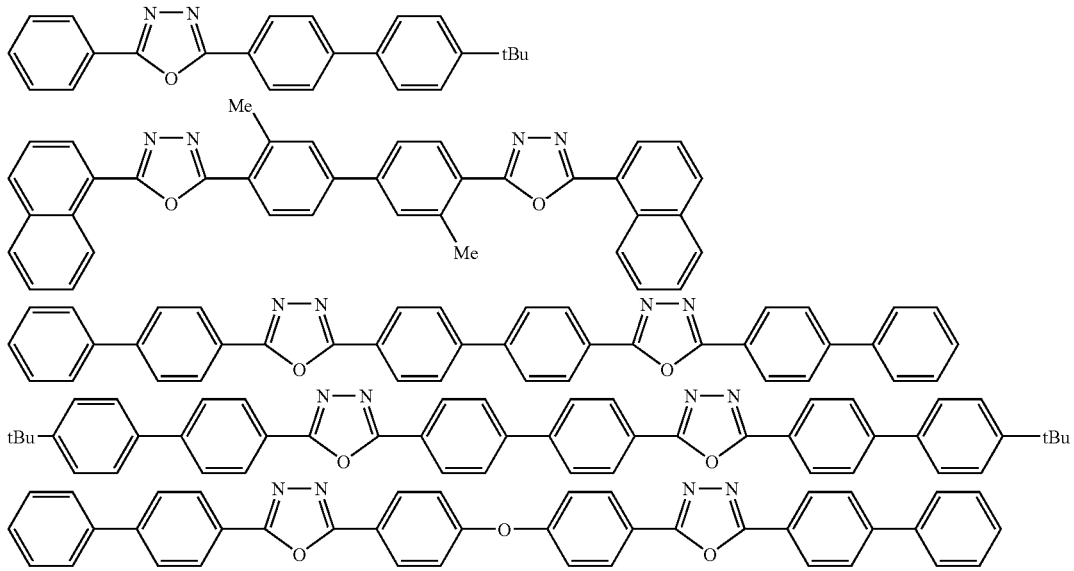

The material used in the electron-transporting layer is preferably a metal complex of 8-hydroxyquinoline or a derivative thereof.

Specific examples of the above-mentioned metal complex of 8-hydroxyquinoline or derivative thereof include metal chelate oxynoid compounds containing a chelate of oxine (generally, 8-quinolinol or 8-hydroxyquinoline).

For example, Alq as described regarding the emitting material can be used for the electron-injecting layer.

Examples of the oxadiazole derivative include electron-transferring compounds represented by the following formulas.

Nitrogen-containing heterocyclic derivatives represented by the following formula:

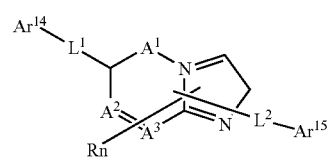

wherein $A^1$ to $A^3$ are independently a nitrogen atom or a carbon atom;

R is an aryl group having 6 to 60 carbon atoms which may have a substituent, a heteroaryl group having 3 to 60 carbon atoms which may have a substituent, an alkyl group having 1 to 20 carbon atoms, a haloalkyl group having 1 to 20 carbon atoms or an alkoxy group having 1 to 20 carbon atoms; n is an integer of 0 to 5; when n is an integer of 2 or more, Rs may be the same or different; and adjacent Rs may be bonded to each other to form a substituted or unsubstituted carbon aliphatic ring or a substituted or unsubstituted carbon aromatic ring;

$Ar^{14}$ is a substituted or unsubstituted aryl group having 6 to 60 carbon atoms or a substituted or unsubstituted heteroaryl group having 3 to 60 carbon atoms;

$Ar^{15}$ is a hydrogen atom, an alkyl group having 1 to 20 carbon atoms, a haloalkyl group having 1 to 20 carbon atoms, an alkoxy group having 1 to 20 carbon atoms, an aryl group having 6 to 60 carbon atoms which may have a substituent or a heteroaryl group having 3 to 60 carbon atoms which may have a substituent;

provided that one of $Ar^{14}$ and $Ar^{15}$ is a substituted or unsubstituted condensed ring having 10 to 60 carbon atoms or a substituted or unsubstituted hetero condensed ring having 3 to 60 carbon atoms; and $L^1$ and $L^2$ are independently a single bond, a substituted or unsubstituted condensed ring having 6 to 60 carbon atoms, a substituted or unsubstituted hetero condensed ring having 3 to 60 carbon atoms or a substituted or unsubstituted fluorenylene group.

Nitrogen-containing heterocyclic derivatives represented by the following formula:

wherein HAr is a nitrogen-containing heterocyclic ring with 3 to 40 carbon atoms which may have a substituent; $L^3$ is a single bond, an arylene group with 6 to 60 carbon atoms which may have a substituent, a heteroarylene group with 3 to 60 carbon atoms which may have a substituent or a fluorenylene group which may have a substituent;

$Ar^{16}$ is a bivalent aromatic hydrocarbon group with 6 to 60 carbon atoms which may have a substituent; and $Ar^{17}$ is an aryl group with 6 to 60 carbon atoms which may have a substituent or a heteroaryl group with 3 to 60 carbon atoms which may have a substituent.

An electroluminescent device using a silacyclopentadiene derivative represented by the following formula, disclosed in JP-A-09-087616:

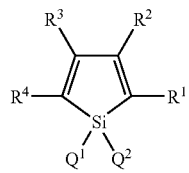

wherein $Q^1$ and $Q^2$ are each a saturated or unsaturated hydrocarbon group with 1 to 6 carbon atoms, an alkoxy group, an alkenyloxy group, an alkynyloxy group, a hydroxyl group, a substituted or unsubstituted aryl group, or a substituted or unsubstituted hetero ring, or $Q^1$ and $Q^2$ are bonded to each other to form a saturated or unsaturated ring; $R^1$ to $R^4$ are each a hydrogen atom, a halogen atom, a substituted or unsubstituted alkyl group with 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoyl group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group or a cyano group, or adjacent groups of $R^1$ to $R^4$ may be joined to form a substituted or unsubstituted condensed ring.

Silacyclopentadiene derivative represented by the following formula, disclosed in JP-A-09-194487:

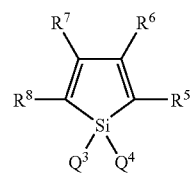

wherein $Q^3$ and $Q^4$ are each a saturated or unsaturated hydrocarbon group with 1 to 6 carbon atoms, an alkoxy group, an alkenyloxy group, an alkynyloxy group, a substituted or unsubstituted aryl group, or a substituted or unsubstituted heterocyclic group, or $Q^3$ and $Q^4$ are bonded to form a saturated or unsaturated ring; and $R^5$ to $R^8$ are each a hydrogen atom, a halogen atom, a substituted or unsubstituted alkyl group with 1 to 6 carbon atoms, an alkoxy group, an aryloxy group, a perfluoroalkyl group, a perfluoroalkoxy group, an amino group, an alkylcarbonyl group, an arylcarbonyl group, an alkoxycarbonyl group, an aryloxycarbonyl group, an azo group, an alkylcarbonyloxy group, an arylcarbonyloxy group, an alkoxycarbonyloxy group, an aryloxycarbonyloxy group, a sulfinyl group, a sulfonyl group, a sulfanyl group, a silyl group, a carbamoyl group, an aryl group, a heterocyclic group, an alkenyl group, an alkynyl group, a nitro group, a formyl group, a nitroso group, a formyloxy group, an isocyano group, a cyanate group, an isocyanate group, a thiocyanate group, an isothiocyanate group or a cyano group, or adjacent groups of $R^5$ to $R^8$ are bonded to form a substituted or unsubstituted condensed ring structure: provided that in the case where $R^5$ and $R^8$ are a phenyl group, $Q^3$ and $Q^4$ are neither an alkyl group nor a phenyl group; in the case where $R^{15}$ and $R^{18}$ are a thienyl group, $Q^3$, $Q^4$, $R^6$ and $R^7$ do not form the structure where $Q^3$ and $Q^4$ are a monovalent hydrocarbon group, and at the same time $R^6$ and $R^7$ are an alkyl group, an aryl group, or an alkenyl group, or $R^6$ and $R^7$ are aliphatic groups which form a ring by bonding to each other; in the case where $R^5$ and $R^8$ are a silyl group, $R^6$, $R^7$, $Q^3$ and $Q^4$ are each neither a monovalent hydrocarbon group with 1 to 6 carbon atoms nor a hydrogen atom; and in the case where a benzene ring is condensed at the position of $R^5$ and $R^6$, $Q^3$ and $Q^4$ are neither an alkyl group nor a phenyl group.

Borane derivatives represented by the following formula, disclosed in JP-A1-2000-040586:

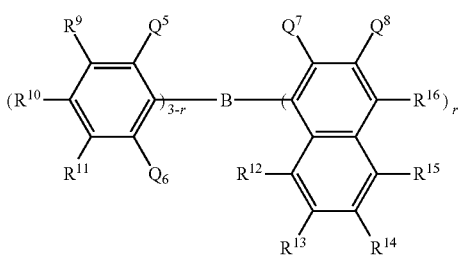

wherein $R^9$ to $R^{16}$ and $Q^8$ are each a hydrogen atom, a saturated or unsaturated hydrocarbon group, an aromatic group, a heterocyclic group, a substituted amino group, a substituted boryl group, an alkoxy group or an aryloxy group; $Q^5$, $Q^6$ and $Q^7$ are each a saturated or unsaturated hydrocarbon group, an aromatic group, a heterocyclic group, a substituted amino group, an alkoxy group or an aryloxy group; the substituents of $Q^7$ and $Q^8$ may be bonded to each other to form a condensed ring; r is an integer of 1 to 3, and $Q^7$s may be different from each other when r is 2 or more; provided that excluded are the compounds where r is 1, $Q^5$, $Q^6$ and $R^{10}$ are a methyl group and $R^{16}$ is a hydrogen atom or a substituted boryl group, and the compounds where r is 3 and $Q^7$ is a methyl group.

Compounds represented by the following formula, disclosed in JP-A-10-088121:

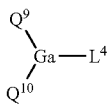

wherein $Q^9$ and $Q^{10}$ are independently a ligand represented by the following formula; and $L^4$ is a halogen atom, a substituted or unsubstituted alkyl group, a substituted or unsubstituted cycloalkyl group, a substituted or unsubstituted aryl group, a substituted or unsubstituted heterocyclic group, —$OR^{17}$ wherein $R^{17}$ is a hydrogen atom, a substituted or unsubstituted alkyl group, a substituted or unsubstituted cycloalkyl group, a substituted or unsubstituted aryl group or a substituted or unsubstituted heterocyclic group, or —O—Ga-$Q^{11}$($Q^{12}$) wherein $Q^{11}$ and $Q^{12}$ are the same legands as $Q^9$ and $Q^{10}$.

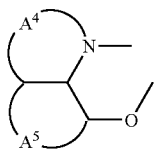

wherein rings $A^4$ and $A^5$ are each a 6-membered aryl ring structure which may have a substituent, and are condensed to each other.

The metal complexes have the strong nature of an n-type semiconductor and large ability of injecting electrons. Further the energy generated at the time of forming a complex is small so that a metal is then strongly bonded to ligands in the complex formed and the fluorescent quantum efficiency becomes large as the emitting material.

Specific examples of the substituents of the rings $A^4$ and $A^5$ which form the ligands of the above formula include halogen atoms such as chlorine, bromine, iodine and fluorine; substituted or unsubstituted alkyl groups such as methyl, ethyl, propyl, butyl, sec-butyl, tert-butyl, pentyl, hexyl, heptyl, octyl, stearyl and trichloromethyl; substituted or unsubstituted aryl groups such as phenyl, naphthyl, 3-methylphenyl, 3-methoxyphenyl, 3-fluorophenyl, 3-trichloromethylphenyl, 3-trifluoromethylphenyl and 3-nitrophenyl; substituted or unsubstituted alkoxy groups such as methoxy, n-butoxy, tert-butoxy, trichloromethoxy, trifluoroethoxy, pentafluoropropoxy, 2,2,3,3-tetrafluoropropoxy, 1,1,1,3,3,3-hexafluoro-2-propoxy and 6-(perfluoroethyl)hexyloxy; substituted or unsubstituted aryloxy groups such as phenoxy, p-nitrophenoxy, p-tert-butylphenoxy, 3-fluorophenoxy, pentafluorophenyl and 3-trifluoromethylphenoxy; substituted or unsubstituted alkylthio groups such as methythio, ethylthio, tert-butylthio, hexylthio, octylthio and trifruoromethyltio; substituted or unsubstituted arylthio groups such as phenylthio, p-nitrophenylthio, p-tert-butylphenylthio, 3-fluorophenylthio, pentafluorophenylthio and 3-trifluoromethylphenylthio; a cyano group; a nitro group; an amino group; mono or di-substituted amino groups such as methylamino, dimethylamino, ethylamino, diethylamino, dipropylamino, dibutylamino and diphenylamino; acylamino groups such as bis(acetoxymethyl)amino, bis(acetoxyethyl)amino, bis(acetoxypropyl)amino and bis(acetoxybutyl)amino; a hydroxy group; a siloxy group; an acyl group; carbamoyl groups such as methylcarbamoyl, dimethylcarbamoyl, ethylcarbamoyl, diethylcarbamoyl, propylcarbamoyl, butylcarbamoyl and phenylcarbamoyl; a carboxylic group; a sulfonic acid group; an imido group; cycloalkyl groups such as cyclopentyl and cyclohexyl; aryl groups such as phenyl, naphthyl, biphenyl, anthranyl, phenanthryl, fluorenyl and pyrenyl; and heterocyclic groups such as pyridinyl, pyrazinyl, pyrimidinyl, pryidazinyl, triazinyl, indolinyl, quinolinyl, acridinyl, pyrrolidinyl, dioxanyl, piperidinyl, morpholidinyl, piperazinyl, triathinyl, carbazolyl, furanyl, thiophenyl, oxazolyl, oxadiazolyl, benzooxazolyl, thiazolyl, thiadiazolyl, benzothiazolyl, triazolyl, imidazolyl, benzoimidazolyl and puranyl. Moreover the above-mentioned substituents may be bonded to each other to form a six-membered aryl or heterocyclic ring.

(4-5) Electron-Injecting Layer

In the invention, an electron-injecting layer which is formed of an insulator or a semiconductor may be provided between a cathode and an electron-injecting layer or between a cathode and an emitting layer. By providing such an electron-injecting layer, current leakage can be effectively prevented to improve the injection of electrons.

As the insulator, a single metal compound or a combination of metal compounds selected from alkali metal calcogenides, alkaline earth metal calcogenides, halides of alkali metals, halides of alkaline earth metals, aluminum oxide, aluminum nitride, titanium oxide, silicon dioxide, germanium oxide, silicon nitride, boron nitride, molybdenum oxide, ruthenium oxide and vanadium oxide can be preferably used. Among these metal compounds, the alkali metal calcogenides or alkaline earth metal calcogenides are preferred in view of the injection of electrons. Preferable alkali metal calcogenides include $Li_2O$, LiO, $Na_2S$, $Na_2Se$ and NaO. Preferable alkaline earth metal calcogenides include CaO, BaO, SrO, BeO, BaS and CaSe. Halides of alkali metals include LiF, NaF, KF, LiCl, KCl and NaCl. Halides of alkaline earth metals include fluorides such as $CaF_2$, $BaF_2$, $SrF_2$, $MgF_2$ and $BeF_2$ and halides other than fluorides.

Examples of the semiconductor for forming the electron-injecting layer include oxides, nitrides or oxynitrides containing at least one element selected from Ba, Ca, Sr, Yb, Al, Ga, In, Li, Na, Cd, Mg, Si, Ta, Sb and Zn, and combinations of two or more thereof.

The electron-injecting layer is preferably microcrystalline or amorphous. Because a more uniform thin film can be formed to reduce pixel defects such as dark spots. Two or more electron-injecting layers may be stacked.

(4-6) Reducing Dopant

A reducing dopant can be contained in an electron transporting region or an interface region between a cathode and an organic layer. The reducing dopant is defined as a substance which can reduce electron-transporting compounds. Various substances having reducibility can be used. The following can be preferably used: alkali metals, alkaline earth metals, rare earth metals, oxides of alkali metals, halides of alkali metals, oxides of alkaline earth metals, halides of alkaline earth metals, oxides of rare earth metals, halides of rare earth metals, organic complexes of alkali metals, organic complexes of alkaline earth metals and organic complexes of rare earth metals.

Preferable examples of the reducing dopant are alkali metals such as Na (work function: 2.36 eV), K (work function: 2.28 eV), Rb (work function: 2.16 eV) and Cs (work function: 1.95 eV) or alkaline earth metals such as Ca (work function: 2.9 eV), Sr (work function: 2.0 to 2.5 eV) and Ba (work function: 2.52 eV). Among these, the reducing dopant is preferably K, Rb or Cs, more preferably Rb or Cs, and even more preferably Cs. Combinations of two or more of these alkali metals are preferable. Combinations with Cs, for example, Cs and Na, Cs and K, Cs and Rb or Cs, Na and K are particularly preferable.

The film thickness of each of the organic layers in the organic EL device of the invention is not particularly limited. In general, defects such as pinholes are easily generated when the film thickness is too small. Conversely, a high applied voltage becomes necessary, leading to worse efficiency when the film thickness is too large. Usually, therefore, the film thickness is preferably in the range of several nanometers to one micrometer.

(5) Light Reflective Layer

As a light reflective layer, a layer is used which reflects and transmits light generated in an organic luminescent medium layer, and can form a light resonator together with the above-mentioned light reflective conductive layer. Specifically metals and dielectric multilayer film can be used.

As the metal, metals such as Ag, Mg, Al, Au, Pt, Cu, Cr, Mo, W, Ta, Nb, Li, Mn, Ca, Yb, Ti, Ir, Be, Hf, Eu, Sr, Ba, Cs, Na and K and alloys thereof can be given. Of these, Al, Ag, Mg, Ce, Na, K, Cs, Li, Au, Pt, Cu, Ca and Ba are preferred. The dielectric multilayer film is a film formed by stacking a low refraction index material and a high refraction index material such that their optical film thicknesses (product of refraction index and film thickness) are each one fourth of light wavelength. Examples of the low refraction index material include $SiO_x$, $NaF$, $LiF$, $CaF_x$, $AlF_x$ and $MgF_x$. Examples of the high refraction index material include $AlO_x$, $MgO_x$, $NdO_x$, $TiO_x$, $CeO_x$, $PbO_x$, $ZnS$, $CdS$ and $ZnSe$. A preferable range of x is $1<x<3$.

The thickness of light reflective layer is preferably 2 nm to 500 nm. If it is thinner than 2 nm, when used as a cathode, the electron injecting properties may be degraded, leading to lower luminous efficiency of the device and difficulty in device fabrication. If it is thicker than 500 nm, the light transmittance may decrease with lower light output efficiency.

The thickness of light reflective layer is particularly preferably 5 nm to 300 nm.

(6) Transparent Electrode Layer

As examples of a transparent electrode, ITO, IZO, tin oxide (NESA), gold, silver, platinum, copper and the like can be given. Of these, indium zinc oxide (IZO) is particularly preferable, since IZO film can be formed at room temperature and is highly amorphous so that separation hardly occurs.

The sheet resistance of the transparent electrode layer is preferably 1000 Ω/□ or less, more preferably 800 Ω/□ or less, even more preferably 500 Ω/□ or less.

In order to outcouple luminescence, the transmittance of the electrode to luminescence is preferably 10% or more, more preferably 30% or more, even more preferably 50% or more.

In view of transmittance and resistance, the thickness of transparent electrode layer is preferably 5 nm to 1000 nm.

(7) Others

In addition to the above layers, a color conversion part and/or color filter may be formed above the transparent electrode layer. In this case, a flatenizing film may be formed between the color conversion part and/or color filter, and transparent electrode layer. The formation of color conversion part or color filter allows full color display even in an organic EL display of two type EL devices (see first and second embodiments).

The color conversion part has the function of absorbing light emitted from the organic EL device and emitting fluorescent light having a longer wavelength. The color conversion part is formed of either a fluorescent material or a combination of a fluorescent material and a transparent medium. The color conversion part may be combined with the color filter described later in order to prevent a decrease in contrast due to external light.

As the fluorescent material, an organic fluorescent dye, an organic fluorescent pigment, a metal complex dye, an inorganic fluorescent material, or the like may be used.

As the transparent medium, an inorganic transparent material such as glass, or a transparent resin such as a thermoplastic resin, a heat-curable resin, or a photocurable resin may be used.

When the color conversion part is formed of a fluorescent material and a resin, a specific configuration is described as follows. A single organic fluorescent dye or plural types of organic fluorescent dyes may be used depending on the desired emission color. When converting blue to blue green exciting light into red light, it is preferable to use a rhodamine dye having a fluorescence peak in a wavelength region of 600 nm or more. It is still more preferable to use a fluorescent dye having an absorption band in the wavelength region of the exciting light and inducing energy transfer or resorption to the rhodamine dye.

The content of the organic fluorescent dye in the color conversion part resin composition is preferably 0.01 to 1 wt %. If the content is less than 0.01 wt %, the color conversion part cannot sufficiently absorb the exciting light, whereby the fluorescence intensity may decrease. If the content is greater than 1 wt %, the distance between the organic fluorescent dye molecules is too reduced in the color conversion part, whereby the fluorescence intensity may decrease due to concentration quenching.

As the inorganic fluorescent material, inorganic compounds such as a metal compound which absorbs visible light and emits fluorescence longer than the absorbed light, can be given. When a dispersion system wherein fine particles of an inorganic fluorescent material are dispersed in a transparent resin medium is used as the color conversion part, the surface of the fine particles may be modified with an organic substance such as a long-chain alkyl group or phosphoric acid in order to increase the dispensability in the resin. Specific examples of the particles are given below.

(a) A metal oxide doped with a transition metal ion (a metal oxide such as $Y_2O_3$, $Gd_2O_3$, ZnO, $Y_3Al_5O_{12}$, or $Zn_2SiO_4$ doped with a transition metal ion such as $Eu^{2+}$, $Eu^{3+}$, $Ce^{3+}$, or $Tb^{3+}$)

(b) A metal chalcogenide doped with a transition metal ion (a metal chalcogenide such as ZnS, CdS, or CdSe doped with a transition metal ion which absorbs visible light, such as $Eu^{2+}$, $Eu^{3+}$, $Ce^{3+}$, or $Tb^{3+}$)

(c) Fine particles absorbing and emitting visible light utilizing band gap of semiconductor (Semiconductor fine particles such as CdS, CdSe, CdTe, ZnS, ZnSe, and InP as known in documents such as JP-A-2002-510866.)

When the color conversion part is formed of a fluorescent material and a resin, the fluorescent material, the resin, and a suitable solvent are mixed, dispersed, or dissolved to prepare a liquid. The liquid is applied by spin coating, roll coating, casting, or the like to form a film. The resulting film is preferably patterned into a desired color conversion part pattern by photolithography, or is preferably patterned into a desired pattern by screen printing or the like, thereby forming a color conversion part.

The thickness of the color conversion part is not particularly limited insofar as the color conversion part sufficiently absorbs light emitted from the organic EL device and does not hinder generation of fluorescence. The thickness of the color conversion part is preferably 10 nm to 1 mm, more preferably 0.5 μm to 1 mm, and still more preferably 1 μm to 100 μm.

As the transparent resin for dispersing the fluorescent material, a non-curable resin or a photocurable resin may be used. The transparent resin may be used either individually or in combination of two or more.

In a full color display, the color conversion parts are separately disposed in matrix form. Therefore, it is preferable to use a photosensitive resin, which allows application of a photolithographic method, as the transparent resin.

A color filter is a film which transmits only light of a desired wavelength emitted from a device and cutoffs the other light.

In the display of the invention, a color filter is preferably used since each organic EL device part emits light of different color.

A color conversion part and color filter are not particularly limited. Known ones can be used.

Next, a method for producing the organic EL display of the invention will be described. An example will be described below where the organic EL display according to the third embodiment of the above embodiments is produced by a method including wet etching. The organic EL displays of the other embodiments can also be similarly produced by the method. Note that a method for producing the organic EL display is not limited to the following method.

Figure 5:
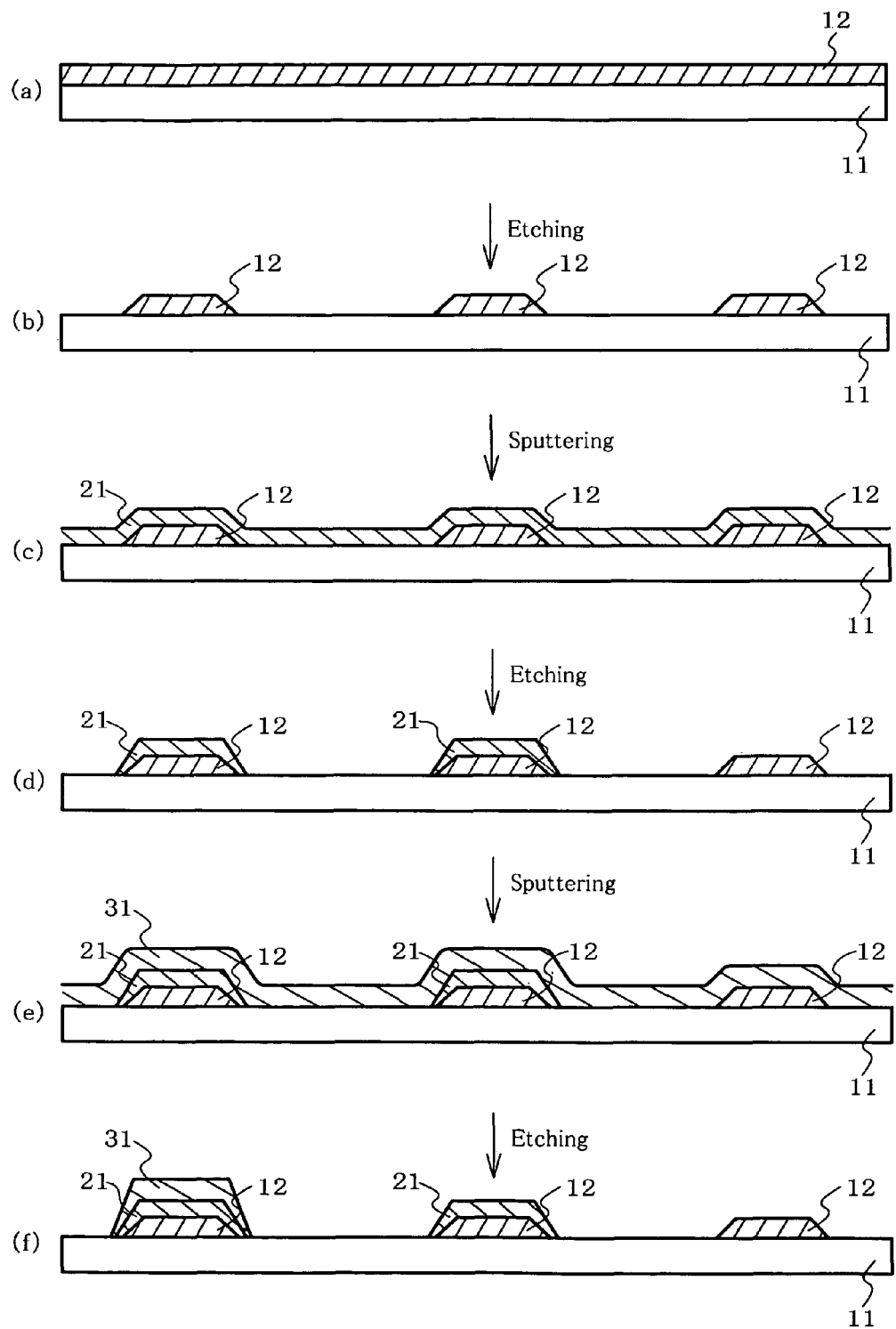
FIG. 5 is a view showing production steps of an organic EL display.
Figure 6:
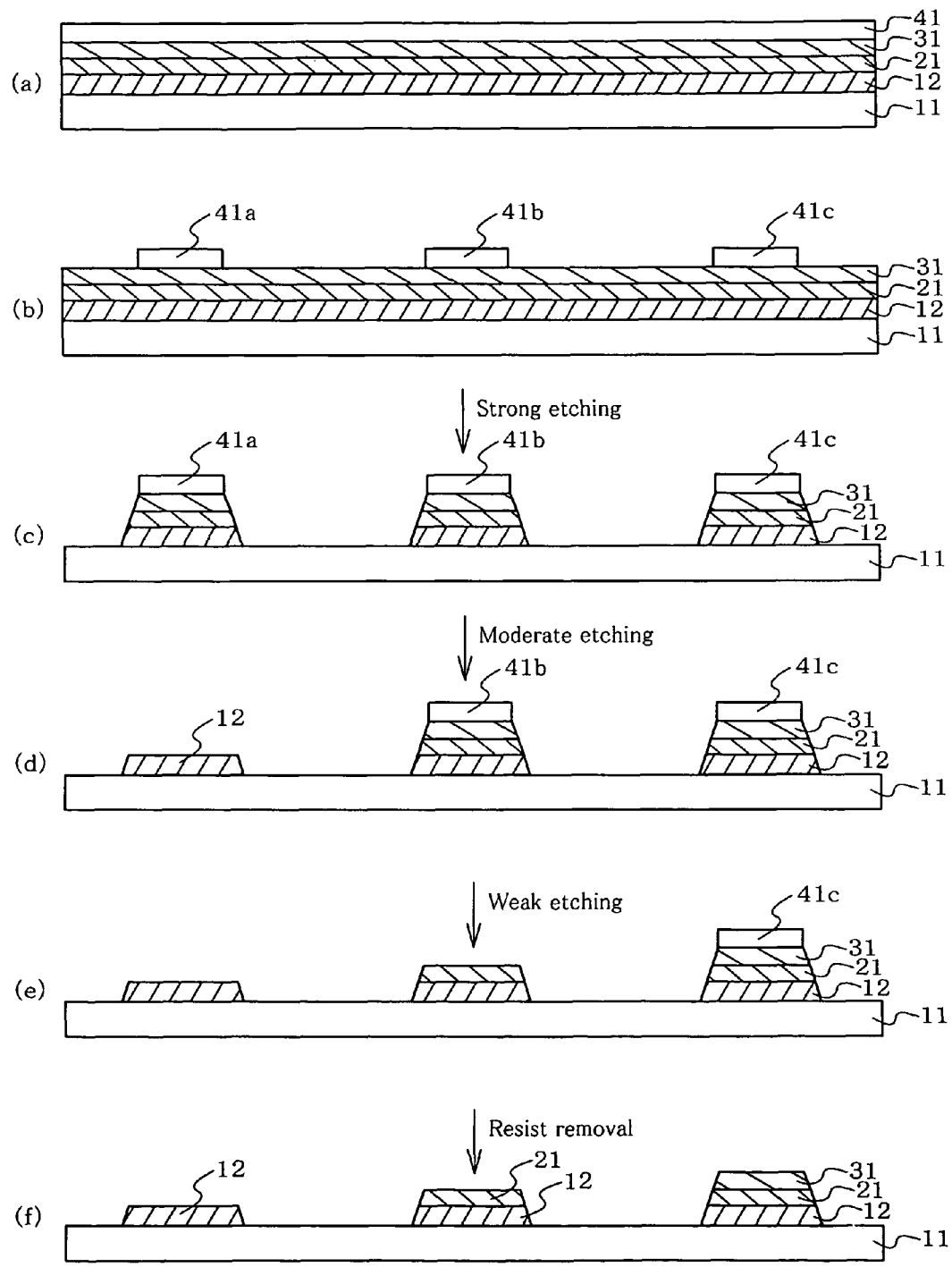
FIG. 6 is another view showing production steps of an organic EL display.
Figure 7:
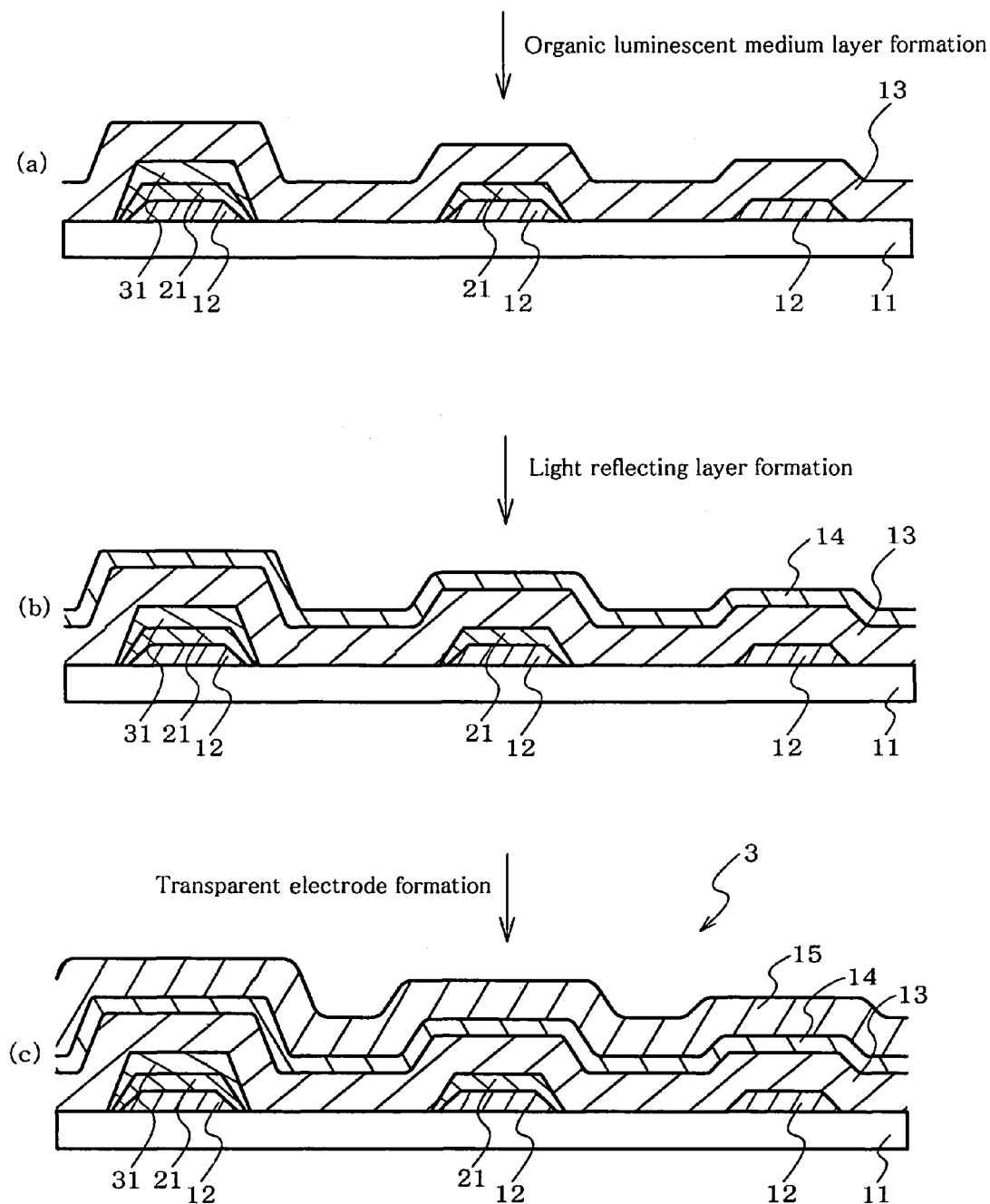
FIG. 7 is a further view showing production steps of an organic EL display.

FIGS. 5 and 6 are views showing the steps for forming a light reflective conductive layer, first inorganic compound layer and second inorganic compound layer on a substrate. FIG. 7 is a view showing the steps for forming an organic luminescent medium layer. The production method shown in FIG. 5 is an example where a film-formation step (dry step) and an etching step (wet step) of each layer are alternately performed. The production method shown in FIG. 6 is an example where film-formation steps are performed at once and etching steps are then performed. The methods for producing organic EL displays will be described below referring to the drawings.

In the substrate production method shown in FIG. 5, a material for a light reflective conductive layer 12 is sputtered to form a film on a substrate 11 (FIG. 5(a)), followed by etching into a desired pattern by photolithography (FIG. 5(b)).

Next, a material for a first inorganic compound layer 21 is sputtered to form a film (FIG. 5(c)) and an unnecessary part is etched with an etchant similarly to the above, thereby forming first inorganic compound layers 21 on light reflective conductive layers 12 of second and third organic EL device parts (FIG. 5(d)).

As described above, the first inorganic compound layer 21 can be formed without etching the light reflective conductive layer 12 which has been formed by selecting materials to be easily etched in the order from a second inorganic compound layer, a first inorganic compound layer and a light reflective conductive layer.

Further, a material for a second inorganic compound layer 31 is sputtered to form a film (FIG. 5(e)) and an unnecessary part is etched with an etchant to form a second inorganic compound layer 31 on the first inorganic compound layer 21 of the third organic EL device part, thereby obtaining a substrate without organic layers to be formed thereon (FIG. 5(f)).

In the production method shown in FIG. 6, layers for a light reflective conductive layer 12, first inorganic compound layer 21 and second inorganic compound layer 31 are sequentially formed on a substrate 11 by sputtering and a resist film 41 is then formed oh the second inorganic compound layer 31 (FIG. 6(a)).

Next, only parts destined to be parts between organic EL device parts are exposed to light and removed (FIG. 6(b)). Thereafter all layers in the parts are removed by etching under relatively strong conditions (FIG. 6(c)).

Next, only a resist film 41a destined to be a first organic EL device part is exposed to light, removed and etched under moderate conditions to form a light reflective conductive layer 12 of the first organic EL device part (FIG. 6(d)).

Next, only a resist film 41b destined to be a second organic EL device part is exposed to light, removed and etched under relatively weak conditions to form a light reflective conductive layer 12 and first inorganic compound layer 21 of the second organic EL device part (FIG. 6(e)).

Last, a resist film 41c destined to be a third organic EL device part is exposed to light and removed to obtain a substrate without organic layers to be formed thereon (FIG. 6(f)).

In this method, dry steps and wet steps are not mixed with large throughput and easy control of foreign substances. Further the method has an advantage of small number of photomasks.

In an organic EL device part with the largest optical length, since the thickness of both a light reflective conductive layer and an inorganic compound layer is great, electrical short circuits tend to occur between its edge and a facing transparent electrode layer 15 to be formed later. In order to prevent decreases on yield, an insulative film may be provided between organic EL device parts so as to cover the edge of an inorganic compound layer of each organic EL device part. As a material for the insulative film, inorganic compounds such as SiOx, SiNx and SiOxNy, and organic compounds such as acrylic photosensitive resins can be used.

An organic luminescent medium layer 13 (FIG. 7(a)), light reflective layer 14 (FIG. 7(b)) and transparent electrode layer 15 (FIG. 7(c)) are formed in this order on the above-obtained substrate with the light reflective conductive layers 12 and each inorganic layer formed thereon, thereby producing an organic EL display 3.

A method for forming each layer of an organic EL device is not particularly limited. The layers can be formed by known methods such as sputtering, vacuum vapor deposition, molecular beam deposition (MBE method), or application of a solution including dipping, spin coating, casting, bar coating and roll coating.

The invention will be described further specifically using examples.

EXAMPLE 1

An organic EL display shown in FIG. 3 was formed through the production steps shown in FIG. 5.

A 300 nm thick light reflective conductive layer was formed by sputtering Cr on a glass substrate having dimensions of 25 mm×75 mm×1.1 mm (see FIG. 5(a)). The substrate was etched using a liquid mixture of ceric ammonium nitrate and hydrogen peroxide to obtain a substrate having a patterned light reflective conductive layer (see FIG. 5(b)).

The substrate having the light reflective conductive layer was mounted in a substrate holder of a vacuum deposition device and ITO was sputtered to form a 145 nm thick first inorganic compound layer (see FIG. 5(c)). Sputtering was conducted in an atmosphere where hydrogen was added at 8% (partial pressure) of the sputtering pressure. The resulting substrate was etched using an oxalate aqueous solution (oxalic acid: 3.5 wt %) to obtain a substrate having a patterned first inorganic compound layer (see FIG. 5(d)).

Next, the substrate was heat-treated for 30 minutes in a furnace at 230° C. to crystallize ITO. The substrate was then mounted in a substrate holder. IZO (zinc oxide: 10 wt % contained) of a noncrystalline inorganic oxide was sputtered to form a 45 nm thick second inorganic compound layer (FIG. 5(e)). The resulting substrate was etched using an oxalate aqueous solution (oxalic acid: 3.5 wt %) to obtain a substrate where a patterned second inorganic compound layer was formed (see FIG. 5(f)).

Subsequently, an organic luminescent medium layer was formed as follows.

A 35 nm thick film of N,N'-bis(N,N'-diphenyl-4-aminophenyl)-N,N-diphenyl-4,4'-diamino-1,1'-biphenyl (hereinafter abbreviated as "TPD232 film") was formed by vacuum deposition so as to cover the above light reflective conductive layer and the like. The film functioned as a hole-injecting layer.

Next, on the TPD232 film, a 10 nm thick film of 4,4'-bis [N-(1-naphthyl)-N-phenylamino]biphenyl (hereinafter abbreviated as "NPD film") was formed. The NPD film functioned as a hole-transporting layer.

Thereafter, a compound (H1) and a compound (B1) shown below were deposited at a weight ratio of 40:1 to form a 5 nm thick film. This film functioned as a blue emitting layer.

A compound (H1) and a compound (O1) were deposited at a weight ratio of 37.5:1 to form a 15 nm thick film. This film functioned as an orange emitting layer.

On the film, a 5 nm thick film of tris(8-quinolinol)aluminum (hereinafter abbreviated as "Alq") was formed as an electron-injecting layer; furthermore, Li (Li source, manufactured by Saesgetter Co.) and Alq was co-deposited to form a 5 nm thick Alq:Li film.

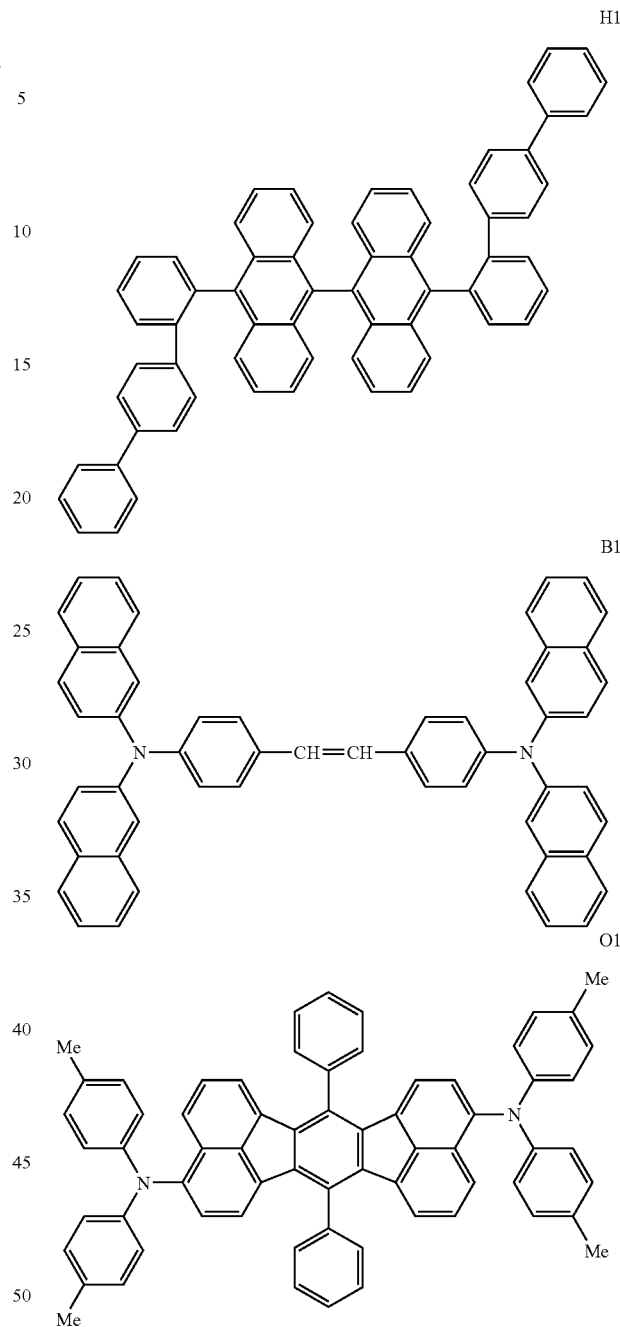

Subsequently, on the Alq:Li film, metal Ag and Mg were deposited in a thickness of 5 nm at a film-forming rate ratio of 1:9. This film functioned as a light reflective layer.

An IZO film was formed in a thickness of 100 nm on the light reflective layer. This film functioned as a transparent electrode layer.

An organic EL display containing three types of organic EL device parts (containing different resonance parts) was fabricated through the steps mentioned above (see FIG. 3).

A voltage of 5.5 V was applied between the light reflective layer and transparent electrode layer of the organic EL display to measure the emission spectra of individual organic EL device parts.

As a result, the organic EL device part (organic EL device part 10 in FIG. 3) in which the optical length of the resonance part was the shortest (151 nm) emitted blue light with a maximum emission wavelength of 470 nm.

The organic EL device part (the organic EL device part 20 in FIG. 3) in which the optical length of the resonance part was middle (433 nm) emitted green light with a maximum emission wavelength of 550 nm.

The organic EL device part (the organic EL device part 30 in FIG. 3) in which the optical length of the resonance part was the longest (522 nm) emitted red light with a maximum emission wavelength of 620 nm.

The above results confirmed that the organic EL display of the invention can emit light of multiple colors and enables full color display.

COMPARATIVE EXAMPLE 1

An organic EL display was fabricated in the same manner as in Example 1 except that a first inorganic compound layer and a second inorganic compound layer were not formed on Cr, a light reflective conductive layer.

As a result, the film thickness between the Cr layer of a light reflective conductive layer and a MG:Ag layer of a light reflective layer was 80 nm (optical film thickness: 151 nm). The device emitted blue light having a maximum emission wavelength of 470 nm.

EXAMPLE 2

A substrate (lower electrode substrate) where from a Cr layer to a second inorganic compound layer were formed was prepared in the same manner as in Example 1 (FIGS. 5(*a*) to (*f*)).

The substrate was subjected to ultrasonic cleaning in isopropyl alcohol for 5 minutes, and then cleaned with ultraviolet ozone for 30 minutes. The cleaned substrate was installed in a substrate holder of a vacuum deposition device. The following compound (HI)(hereinafter HI film) as a hole-injecting material, the following compound (HT) (hereinafter HT film) as a hole-transporting material, the following compound (BH) as a host of an emitting material, the following compound (BD) as a blue emitting dopant, the following compound (GD) as a green emitting dopant, the following compound (RD) as a red emitting dopant, a tris(8-quinolinol) aluminum (Alq) as an electron-transporting material, LiF as an electron-injecting material, and Mg and Ag as a light reflective layer (cathode) material were charged in advance in individual molybdenum heating boats. As a hole injecting supporting material and a leading electrode of a cathode, a IZO target was installed in another sputtering vessel.

BH

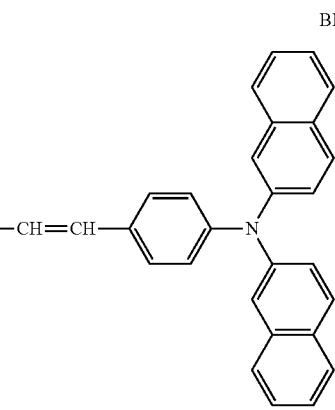

BD

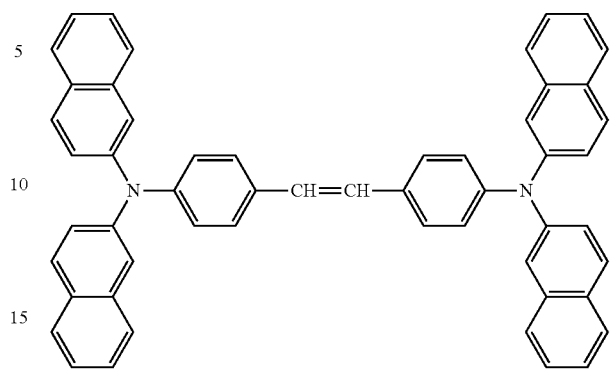

GD

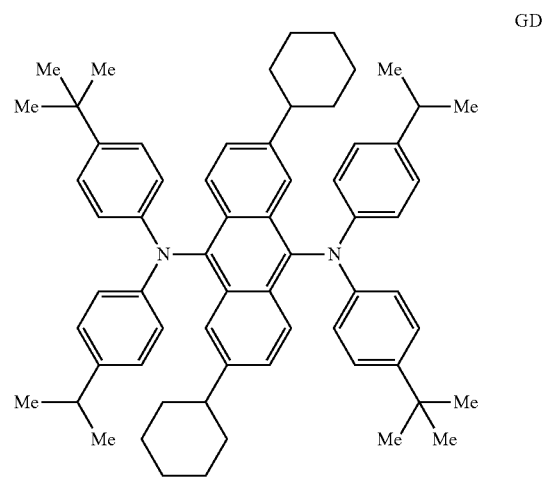

RD

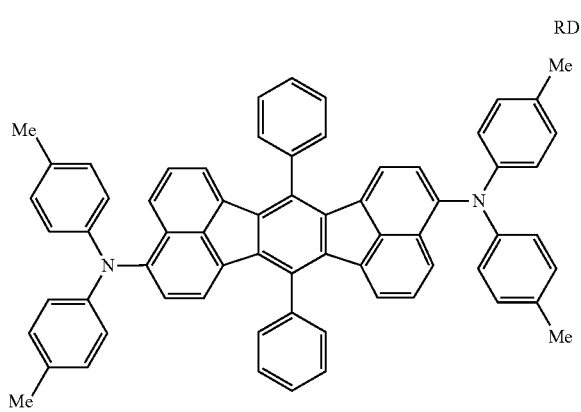

HI

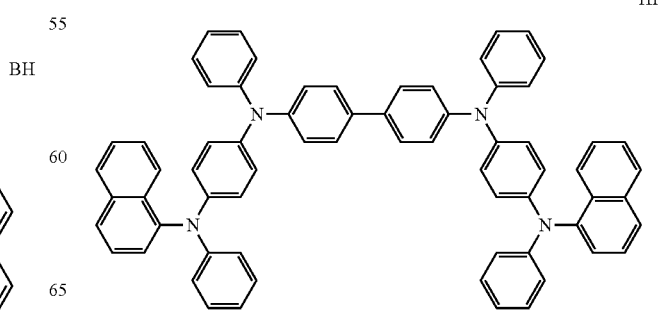

HT

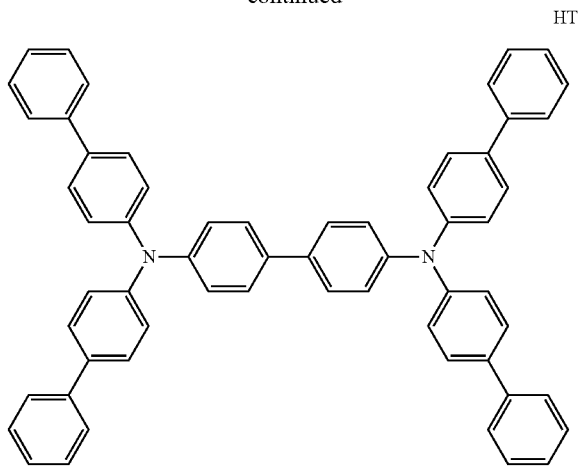

First, IZO was deposited in a thickness of 1 nm by sputtering as a hole injecting supporting layer so as to cover a lower electrode. Next, an HI film functioning as a hole-injecting layer was deposited in a thickness of 25 nm. Following the HI film formation, an HT film functioning as a hole-transporting layer was deposited in a thickness of 10 nm. After forming the HT film, as a blue emitting layer, the compound BH and compound BD were co-deposited in a thickness of 10 nm at a weight ratio of 10:0.5. Next, as a green emitting layer, the compound BH and compound GD were co-deposited in a thickness of 10 nm at a weight ratio of 10:0.8. Further, as a red emitting layer, the compound BH and compound RD were co-deposited in a thickness of 20 nm at a weight ratio of 20:0.5.

On the film, as an electron-transporting layer, an Alq film was deposited in a thickness of 10 nm. As an electron-injecting layer, LiF was deposited in a thickness of 1 nm, and as a light reflective layer (cathode), Ag and Mg was deposited thereon in a thickness of 10 nm at a film-formation rate ratio of 1:9. Further, as a transparent electrode layer, an IZO film was formed by sputtering in a thickness of 90 nm to fabricate an organic EL display having three emitting layers.

The thickness between the Cr layer of a light reflective conductive layer and Mg:Ag layer of a light reflective layer was 85 nm (optical film thickness: 160 nm).

A voltage of 7.2 V was applied between the light reflective conductive layer and transparent electrode of the organic EL display to measure the emission spectra of individual organic EL device parts.

As a result, the organic EL device part (organic EL device part 10 in FIG. 3) in which the optical length of the resonance part was the shortest (160 nm) emitted blue light with a maximum emission wavelength of 454 nm, a luminous efficiency of 4.9 cd/A and a chromaticity of (0.21, 0.26).

The organic EL device part (organic EL device part 20 in FIG. 3) in which the optical length of the resonance part was middle (442 nm) emitted green light with a maximum emission wavelength of 520 nm, a luminous efficiency of 6.2 cd/A and a chromaticity of (0.23, 0.48).

The organic EL device part (organic EL device part 30 in FIG. 3) in which the optical length of the resonance part was the longest (531 nm) emitted purple-red light with a maximum emission wavelength of 588 nm, a luminous efficiency of 3.6 cd/A and a chromaticity of (0.41, 0.32).

EXAMPLE 3

Fabrication of Organic EL Device Substrate

A light reflective conductive layer, organic luminescent medium layer, light reflective layer and transparent electrode were formed in the same manner as in Example 2.

Next, on the transparent electrode layer of the organic EL device, as a transparent inorganic film, a SiOxNy (O/O+ N=50%: Atomic ratio) film was formed in a thickness of 300 nm by low temperature CVD so as to cover the entire organic EL emitting part as a sealing layer to obtain an organic EL device substrate.

Fabrication of Color Filter Substrate

A shielding layer pattern was formed on a glass substrate having dimensions of 25 mm×75 mm×1.1 mm. As a shielding layer, a 50 nm thick chrome oxide film and a 300 nm thick chrome film were sequentially stacked by sputtering.

Next, on the shielding layer, a positive-type resist ("HPR204" manufactured by Fujifilm Olin Co., Ltd.) film was formed by spin coating. Subsequently, the resist film was exposed to ultraviolet rays through a photomask. The film was then developed using a TMAH (tetramethylammonium hydroxide) developer and baked at 130° C. The exposed chrome layer and chrome oxide layer were etched using a chrome etchant of a ceric ammonium nitrate/perchloric acid aqueous solution. Subsequently, the resist was removed with a stripper containing ethanolamine as the major component ("N303" manufactured by Nagase & Co., Ltd.) to obtain a lattice-shaped shielding layer pattern with a width of 30 μm.

V259 (manufactured by Nippon Steel Chemical Co., Ltd.) as a material for a blue (B) filter layer pattern was applied by spin coating on a supporting substrate to form a film. Ultraviolet rays were applied through a photomask aligned with the shielding layer. The resultant film was then developed using a 2% sodium carbonate aqueous solution and baked at 200° C. to obtain a blue color filter layer pattern (thickness: 1.5 μm).

Next, a pigment-type green color filter material (CG-8510L, manufactured by FUJIFILM Arch Co., Ltd.) as a material for a green (G) color filter layer pattern was applied by spin coating to form a film. Ultraviolet rays were applied through the photomask used for the blue color filter layer pattern displaced at 100 μm pitch from the blue color filter layer pattern. The film was then baked at 200° C. to obtain a green color filter layer pattern (thickness: 1.0 μm).

Next, a pigment-type red color filter material (CRY-S840B, manufactured by FUJIFILM Arch Co., Ltd.) as a material for a red (R) color filter layer pattern was applied by spin coating to form a film. Ultraviolet rays were applied through the photomask used for the blue color filter layer pattern displaced at 200 μm pitch from the blue color filter layer pattern. The film was then baked at 200° C. to obtain a red color filter layer pattern (thickness: 1.2 μm). A color filter substrate of three colors was thus fabricated.

A liquid silicone rubber (XE14-128, manufactured by Toshiba Silicone Co. Ltd.) was applied on the color filter substrate fabricated by the above method using a spin-coater. The above organic EL device substrate was adhered thereto matching a positioning mark to fabricate an organic EL display where the color filters were formed. Its configuration was glass substrate/color filter/silicone rubber/transparent inorganic film/organic EL device.

A voltage of 7.2 V was applied between the light reflective conductive layer and transparent electrode of the organic EL display to measure the emission spectra of individual organic EL device parts.

As a result, the organic EL device part (organic EL device part 10 in FIG. 3) in which the optical length of the resonance part was the shortest (160 nm) emitted blue light with a maximum emission wavelength of 453 nm, a luminous efficiency of 0.98 cd/A and a chromaticity of (0.13, 0.09).

The organic EL device part (the organic EL device part 20 in FIG. 3) in which the optical length of the resonance part was middle (442 nm) emitted green light with a maximum emission wavelength of 520 nm, a luminous efficiency of 4.4 cd/A and a chromaticity of (0.20, 0.63).

The organic EL device part (the organic EL device part 30 in FIG. 3) in which the optical length of the resonance part was the longest (531 nm) emitted red light with a maximum emission wavelength of 599 nm, a luminous efficiency of 1.36 cd/A and a chromaticity of (0.63, 0.36).

INDUSTRIAL APPLICABILITY

An organic EL display of the invention can be used for display screens of various displays such as consumer TVs, large-screen displays, and portable telephones.

The invention claimed is:

1. An organic electroluminescent display comprising:
a substrate; and
a first organic electroluminescent device part and a second organic electroluminescent device part placed side by side on a surface of the substrate;
the first organic electroluminescent device part including at least a light reflective conductive layer, a first metal oxide layer, an organic luminescent medium layer, and a transparent electrode layer in this order and including a light reflective layer inside or outside of the organic luminescent medium layer or the transparent electrode layer;
the second organic electroluminescent device part including at least a light reflective conductive layer, a first metal oxide layer, a second metal oxide layer, an organic luminescent medium layer, and a transparent electrode layer in this order and including a light reflective layer inside or outside of the organic luminescent medium layer or the transparent electrode layer;
the second metal oxide layer being able to be etched more easily than the first metal oxide layer, wherein at least one metal oxide compound in the first metal oxide layer is a different compound from a metal oxide compound in the second metal oxide layer, or vice-versa; and
an emission spectrum of light from the first organic electroluminescent device part differing from an emission spectrum of light from the second organic electroluminescent device part.

2. An organic electroluminescent display comprising:
a substrate; and
a first organic electroluminescent device part, a second organic electroluminescent device part, and a third organic electroluminescent device part placed side by side on a single surface of the substrate;
the first organic electroluminescent device part including at least a light reflective conductive layer, an organic luminescent medium layer, and a transparent electrode layer in this order and including a light reflective layer inside or outside of the organic luminescent medium layer or the transparent electrode layer;
the second organic electroluminescent device part including at least a light reflective conductive layer, a first metal oxide layer, an organic luminescent medium layer, and a transparent electrode layer in this order and including a light reflective layer inside or outside of the organic luminescent medium layer or the transparent electrode layer;
the third organic electroluminescent device part including at least a light reflective conductive layer, a first metal oxide layer, a second metal oxide layer, an organic luminescent medium layer, and a transparent electrode layer in this order and including a light reflective layer inside or outside of the organic luminescent medium layer or the transparent electrode layer;
the second metal oxide layer being able to be etched more easily than the first metal oxide layer, wherein at least one metal oxide compound in the first metal oxide layer is a different compound from a metal oxide compound in the second metal oxide layer, or vice-versa; and
emission spectra of light from the first, second, and third organic electroluminescent device parts differing from one another.

3. The organic electroluminescent display according to claim 1, wherein crystallinity of the first metal oxide layer is higher than crystallinity of the second metal oxide layer.

4. The organic electroluminescent display according to claim 1, wherein the first metal oxide layer is crystalline, and the second metal oxide layer is noncrystalline.

5. The organic electroluminescent display according to claim 3, wherein at least one of the first metal oxide layer and the second metal oxide layer includes an oxide of an element selected from the group consisting of In, Sn, Zn, Ce, Sm, Pr, Nb, Tb, Cd, Ga, Al, Mo, and W.

6. The organic electroluminescent display according to claim 3, wherein at least one of the first metal oxide layer and the second metal oxide layer includes an oxide of an element selected from the group consisting of In, Sn, and Zn.

7. The organic electroluminescent display according to claim 1, wherein the light reflective conductive layer includes a metal selected from the group consisting of Al, Ag, Au, Pt, Cu, Mg, Cr, Mo, W, Ta, Nb, Li, Mn, Ca, Yb, Ti, Ir, Be, Hf, Eu, Sr, Ba, Cs, Na, and K, or an alloy containing at least one metal selected from the group.

8. The organic electroluminescent display according to claim 1, wherein the light reflective layer includes one, or two or more metal elements selected from the group consisting of Al, Ag, Au, Pt, Cu, Mg, Cr, Mo, W, Ta, Nb, Li, Mn, Ca, Yb, Ti, Ir, Be, Hf, Eu, Sr, Ba, Cs, Na, and K.

9. The organic electroluminescent display according to claim 1, further comprising a color filter.

10. A method of producing the organic electroluminescent display according to claim 1, the method comprising:
selecting, as a material of a second metal oxide layer, a material that has a lower crystallinity than a crystallinity of a first metal oxide layer, wherein at least one metal oxide compound in the first metal oxide layer is a different compound from a metal oxide compound in the second metal oxide layer, or vice-versa; and
forming the second metal oxide layer by wet etching after forming the first metal oxide layer.

11. The organic electroluminescent display according to claim 2, wherein crystallinity of the first metal oxide layer is higher than crystallinity of the second metal oxide layer.

12. The organic electroluminescent display according to claim 2, wherein the first metal oxide layer is crystalline, and the second metal oxide layer is noncrystalline.

13. The organic electroluminescent display according to claim 11, wherein at least one of the first metal oxide layer and the second metal oxide layer includes an oxide of an element selected from the group consisting of In, Sn, Zn, Ce, Sm, Pr, Nb, Tb, Cd, Ga, Al, Mo, and W.

14. The organic electroluminescent display according to claim 11, wherein at least one of the first metal oxide layer and the second metal oxide layer includes an oxide of an element selected from the group consisting of In, Sn, and Zn.

15. The organic electroluminescent display according to claim 2, wherein the light reflective conductive layer includes a metal selected from the group consisting of Al, Ag, Au, Pt, Cu, Mg, Cr, Mo, W, Ta, Nb, Li, Mn, Ca, Yb, Ti, Ir, Be, Hf, Eu, Sr, Ba, Cs, Na, and K, or an alloy containing at least one metal selected from the group.

16. The organic electroluminescent display according to claim 2, wherein the light reflective layer includes one, or two or more metal elements selected from the group consisting of Al, Ag, Au, Pt, Cu, Mg, Cr, Mo, W, Ta, Nb, Li, Mn, Ca, Yb, Ti, Ir, Be, Hf, Eu, Sr, Ba, Cs, Na, and K.

17. The organic electroluminescent display according to claim 2, further comprising a color filter.

18. A method of producing the organic electroluminescent display according to claim 2, the method comprising:

selecting, as a material of a second metal oxide layer, a material that has a lower crystallinity than a crystallinity of a first metal oxide layer, wherein at least one metal oxide compound in the first metal oxide layer is a different compound from a metal oxide compound in the second metal oxide layer, or vice-versa; and forming the second metal oxide layer by wet etching after forming the first metal oxide layer.

19. The organic electroluminescent display according to claim 1, wherein the first metal oxide layer comprises indium tin oxide and the second metal oxide layer comprises indium zinc oxide.

20. The organic electroluminescent display according to claim 2, wherein the first metal oxide layer comprises indium tin oxide and the second metal oxide layer comprises indium zinc oxide.

* * * * *